US00RE48429E

(19) United States
(12) Reissued Patent
Ichinose

(10) Patent Number: US RE48,429 E
(45) Date of Reissued Patent: Feb. 9, 2021

(54) SUBSTRATE HOLDING METHOD, SUBSTRATE HOLDING APPARATUS, EXPOSURE APPARATUS AND EXPOSURE METHOD

(71) Applicant: NIKON CORPORATION, Tokyo (JP)

(72) Inventor: Go Ichinose, Fukaya (JP)

(73) Assignee: NIKON CORPORATION, Tokyo (JP)

(21) Appl. No.: 16/003,207

(22) Filed: Jun. 8, 2018

Related U.S. Patent Documents

Reissue of:
(64) Patent No.: 9,865,494
Issued: Jan. 9, 2018
Appl. No.: 14/892,336
PCT Filed: May 23, 2013
PCT No.: PCT/JP2013/064414
§ 371 (c)(1),
(2) Date: Jan. 4, 2016
PCT Pub. No.: WO2014/188572
PCT Pub. Date: Nov. 27, 2014

(51) Int. Cl.
*G03F 7/20* (2006.01)
*H01L 21/687* (2006.01)
*H01L 21/683* (2006.01)

(52) U.S. Cl.
CPC ..... *G03F 7/707* (2013.01); *G03F 7/20* (2013.01); *G03F 7/70733* (2013.01); *H01L 21/6838* (2013.01); *H01L 21/6875* (2013.01); *H01L 21/68742* (2013.01)

(58) Field of Classification Search
CPC ..... H01L 21/6838; H01L 21/68742; H01L 21/6875; G03F 7/707; G03F 7/20; G03F 7/70733
See application file for complete search history.

(56) References Cited

U.S. PATENT DOCUMENTS 5,923,408 A * 7/1999 Takabayashi ..... G03F 7/707 355/53
6,149,727 A 11/2000 Yoshioka et al.
6,184,972 B1 2/2001 Mizutani et al.
6,590,633 B1 7/2003 Nishi et al.
2003/0164934 A1 9/2003 Nishi et al.
(Continued)

FOREIGN PATENT DOCUMENTS

JP 2010-226039 A 10/2010
WO 2012026262 A1 3/2012

OTHER PUBLICATIONS

Aug. 7, 2019 Notice of Allowance issued in U.S. Appl. No. 15/845,654.

(Continued)

*Primary Examiner* — William C Doerrler
(74) *Attorney, Agent, or Firm* — Oliff PLC

(57) ABSTRACT

A wafer holding apparatus for holding a wafer including a wafer holder on which the wafer is placed; and a lift pin that is configured to be lifted up and down with respect to the wafer holder in a direction along a normal line of a placement surface of the wafer, the lift pin includes a tip part, the tip part includes: a bottom part that forms a suction region for sucking a rear surface of the wafer; and a convex part that supports the rear surface of the wafer in the suction region. When a substrate is placed on a target position, it is possible to prevent a local deterioration of flatness of the substrate even if the substrate is large.

41 Claims, 13 Drawing Sheets

(56) References Cited

U.S. PATENT DOCUMENTS

| | | | | |
|---|---|---|---|---|
| 2007/0128889 | A1* | 6/2007 | Goto | H01L 21/6875 438/795 |
| 2007/0252970 | A1* | 11/2007 | Shibazaki | H01L 21/6838 355/72 |
| 2008/0068580 | A1 | 3/2008 | Mori et al. | |
| 2013/0146785 | A1* | 6/2013 | Gilissen | H01L 21/68742 250/453.11 |
| 2014/0293257 | A1* | 10/2014 | Yoo | G03F 7/70691 355/73 |

OTHER PUBLICATIONS

May 2, 2017 Office Action Issued in U.S. Appl. No. 14/892,336.
Sep. 5, 2017 Notice of Allowance issued in U.S. Appl. No. 14/892,336.
Dec. 13, 2017 Office Action issued in European Application No. 13 885 187.8.
Feb. 13, 2019 Office Action issued in U.S. Appl. No. 15/845,654.
Apr. 18, 2018 Office Action issued in Taiwan Patent Application No. 103118054.
Aug. 31, 2018 Office Action issued in U.S. Appl. No. 15/845,654.
May 20, 2019 Office Action issued in Taiwanese Patent Application No. 107139756.
Oct. 25, 2018 Office Action issued in European Application No. 13885187.8.
Nov. 29, 2018 Office Action issued in Chinese Patent Application No. 201380078446.X.
Dec. 8, 2016 Search Report issued in European Application No. 13885187.8.
Jun. 2, 2017 Office Action issued in Chinese Application No. 201380078446.X.

* cited by examiner

[FIG. 1]
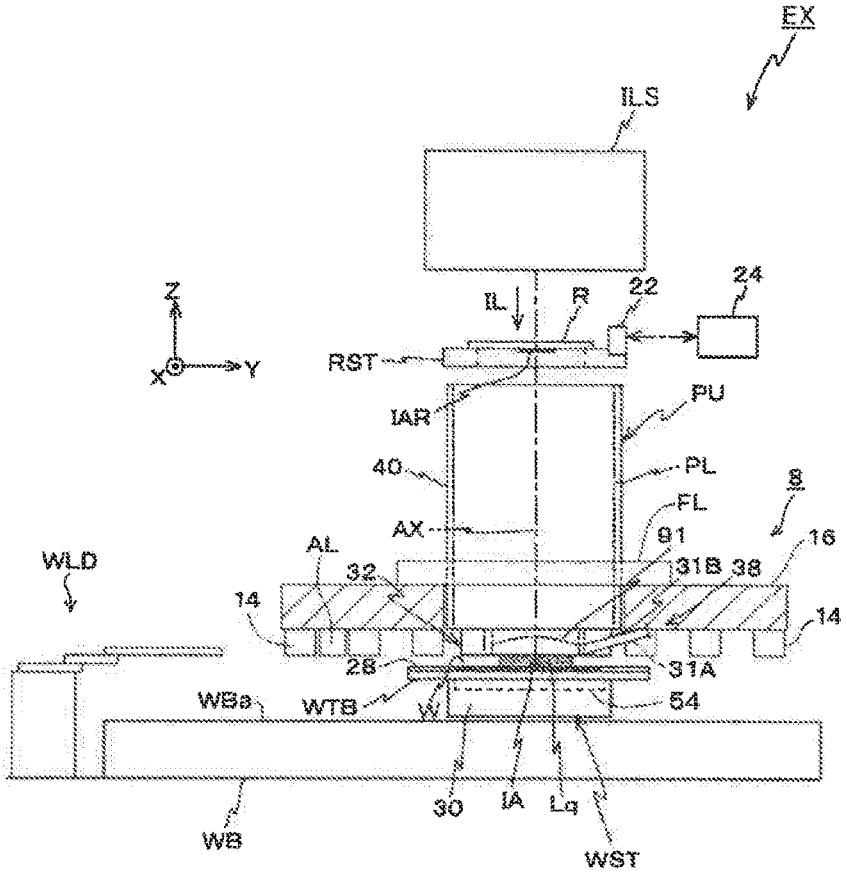

[FIG. 2]
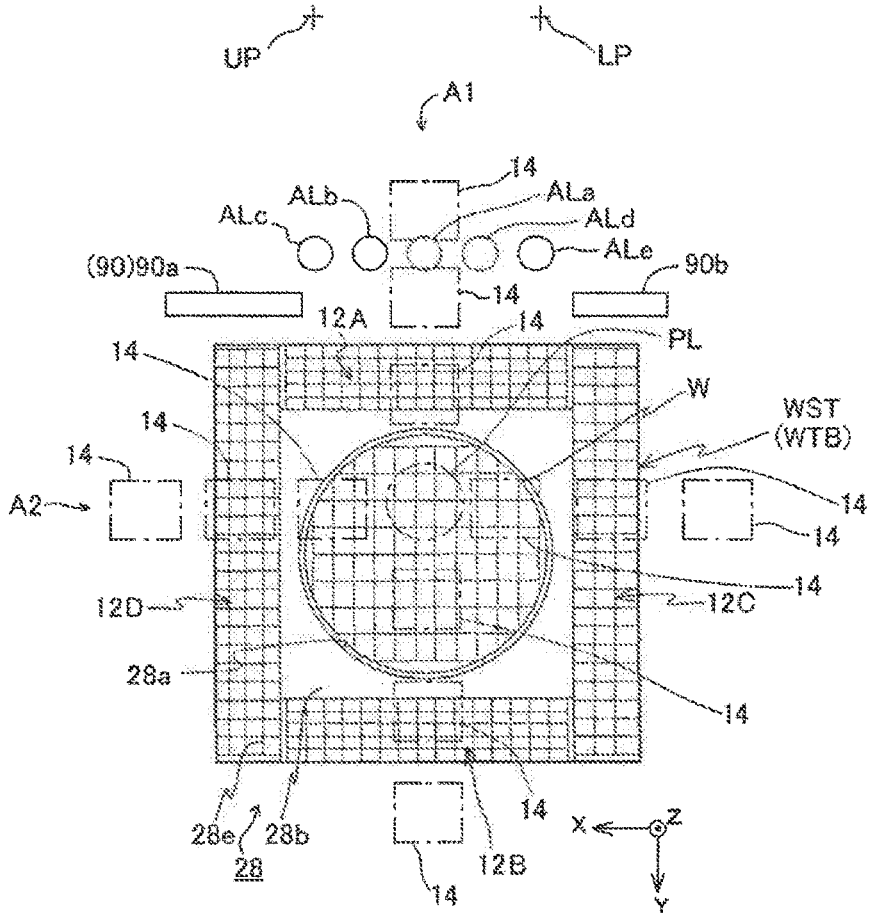

[FIG. 3]
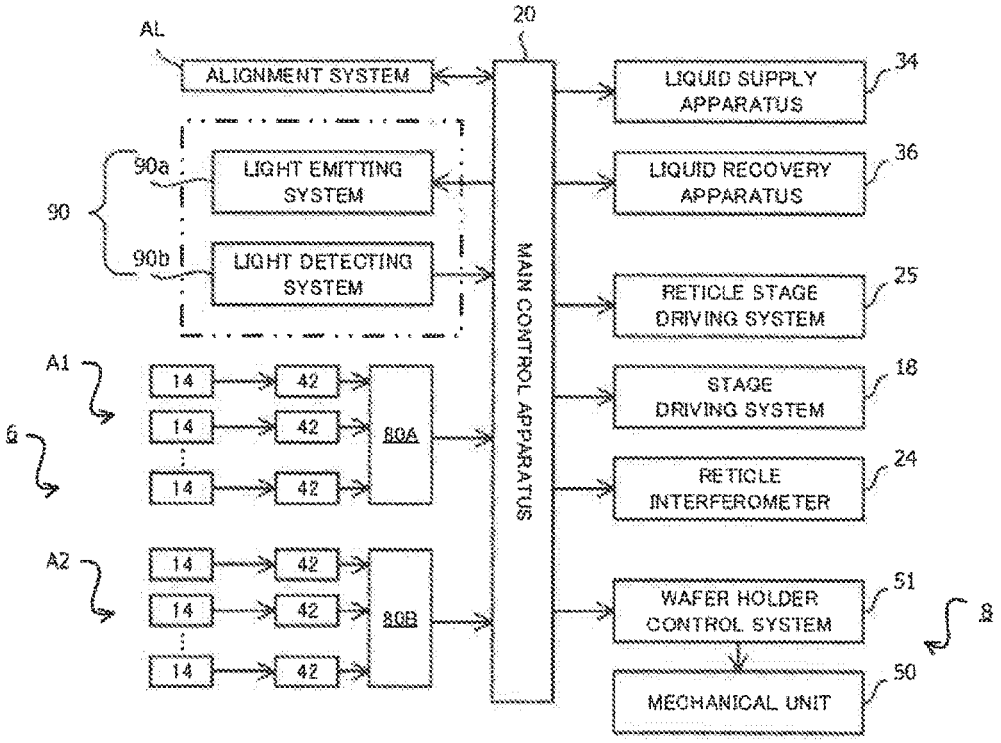

[FIG. 4]
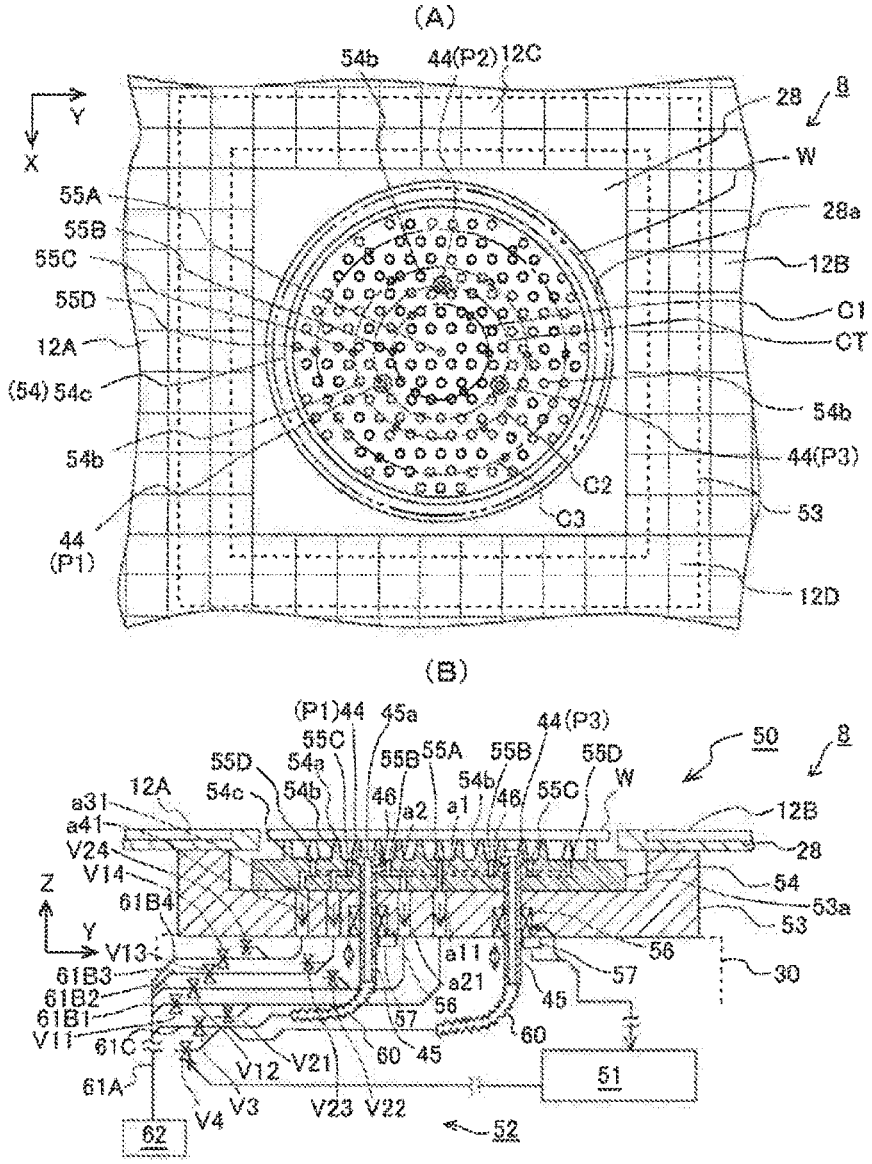

[FIG. 5]
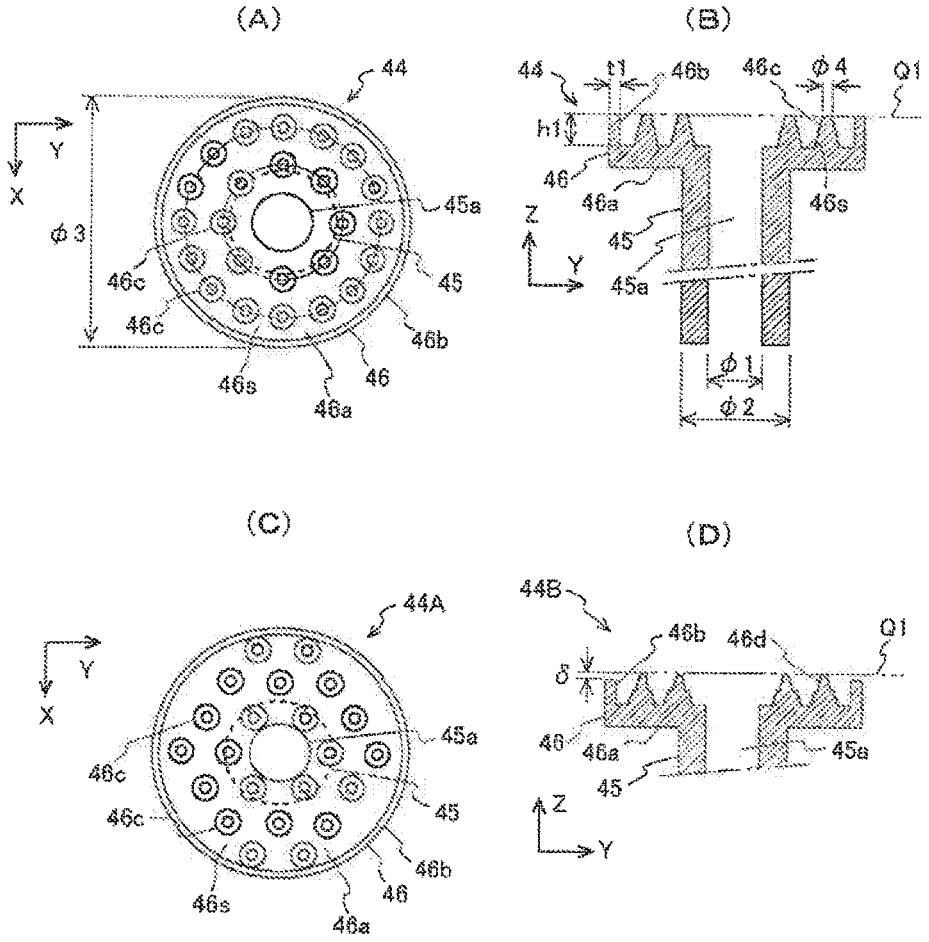

[FIG. 6]
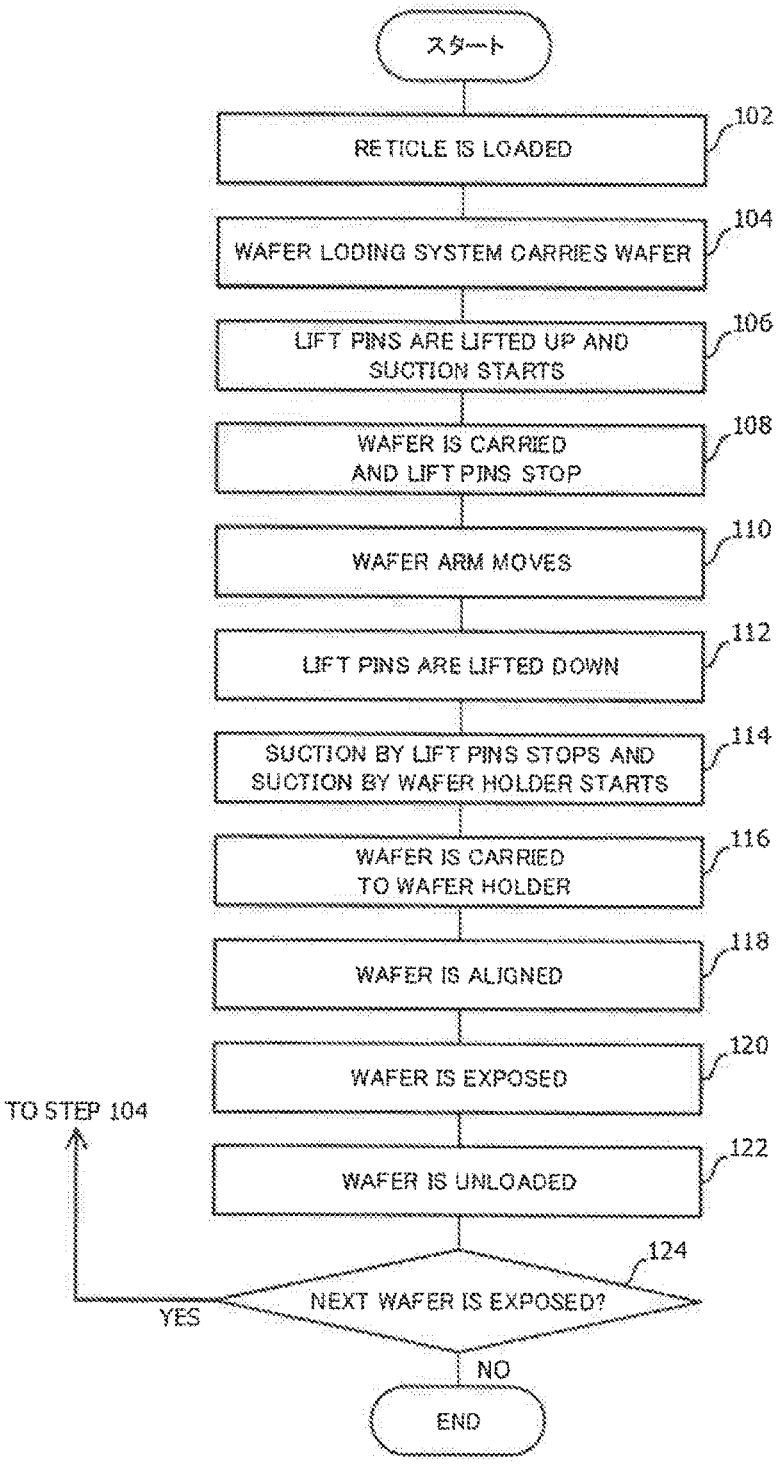

[FIG. 7]
(A)
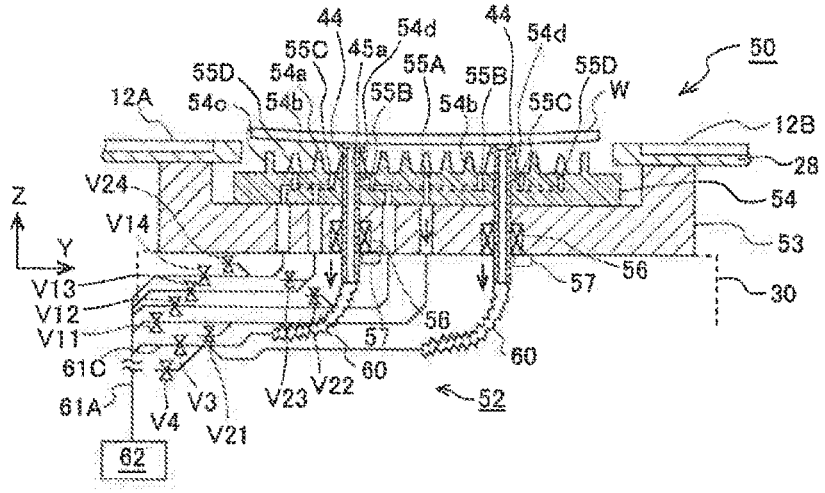
(B)
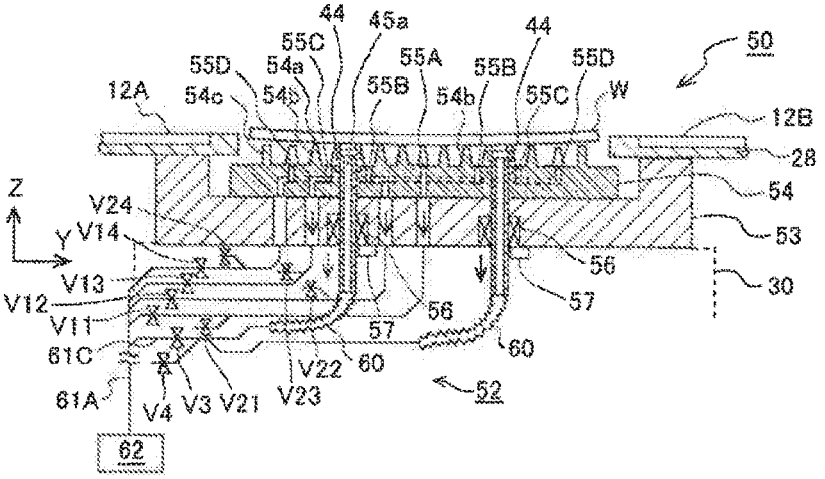

[FIG. 8]
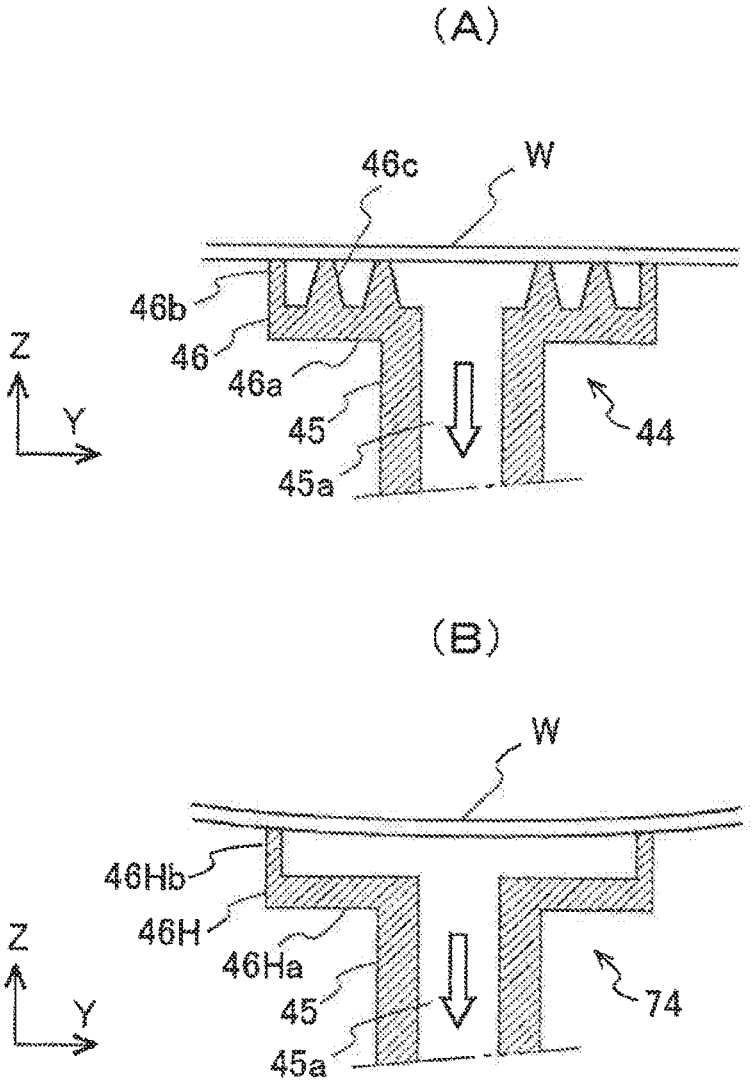

[FIG. 9]
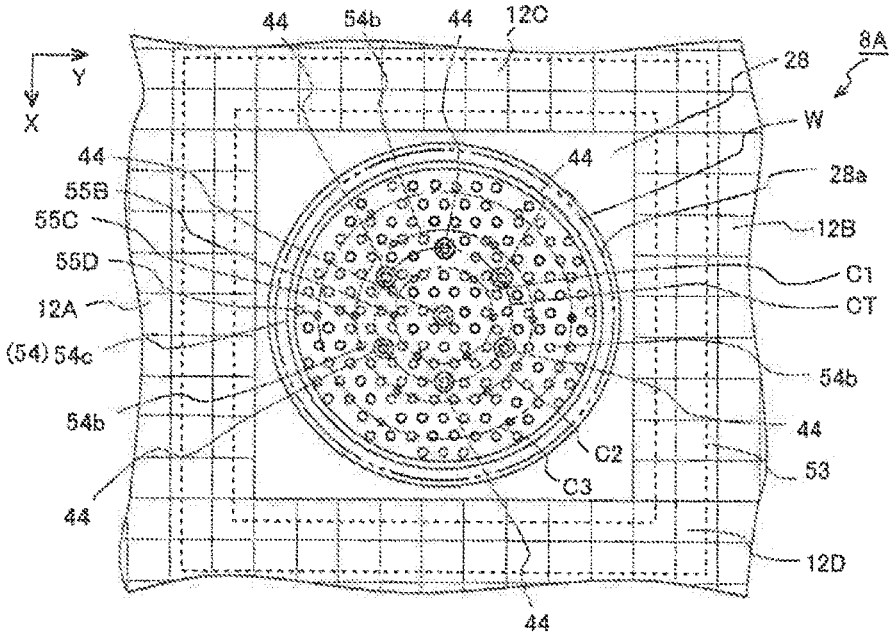

[FIG. 10]
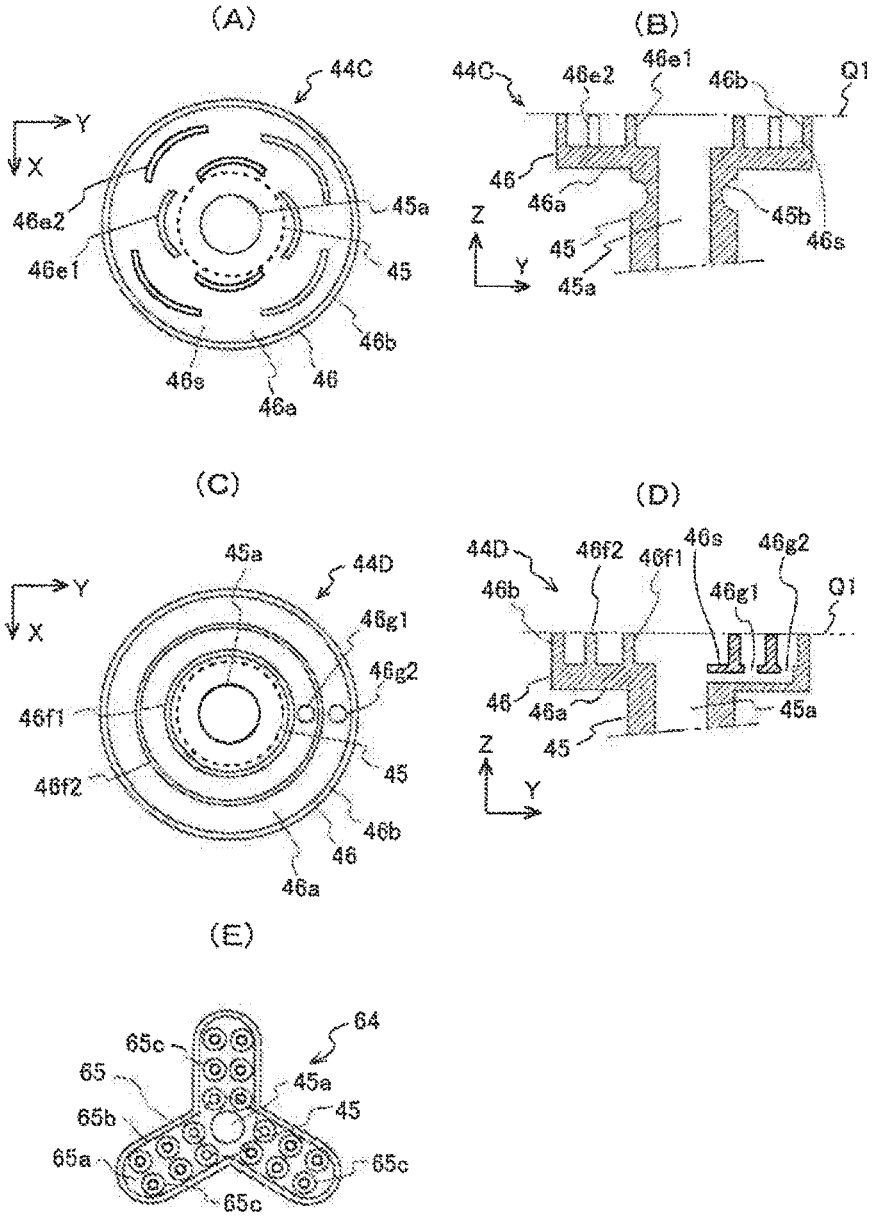

[FIG. 11]
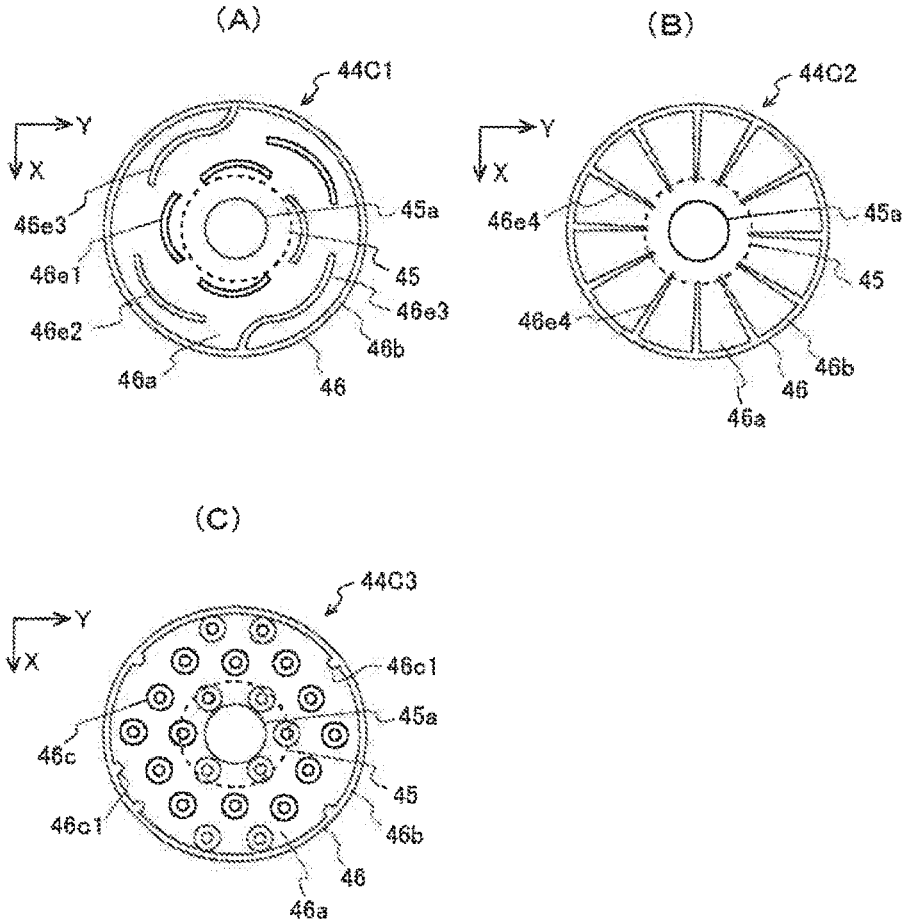

[FIG. 12]
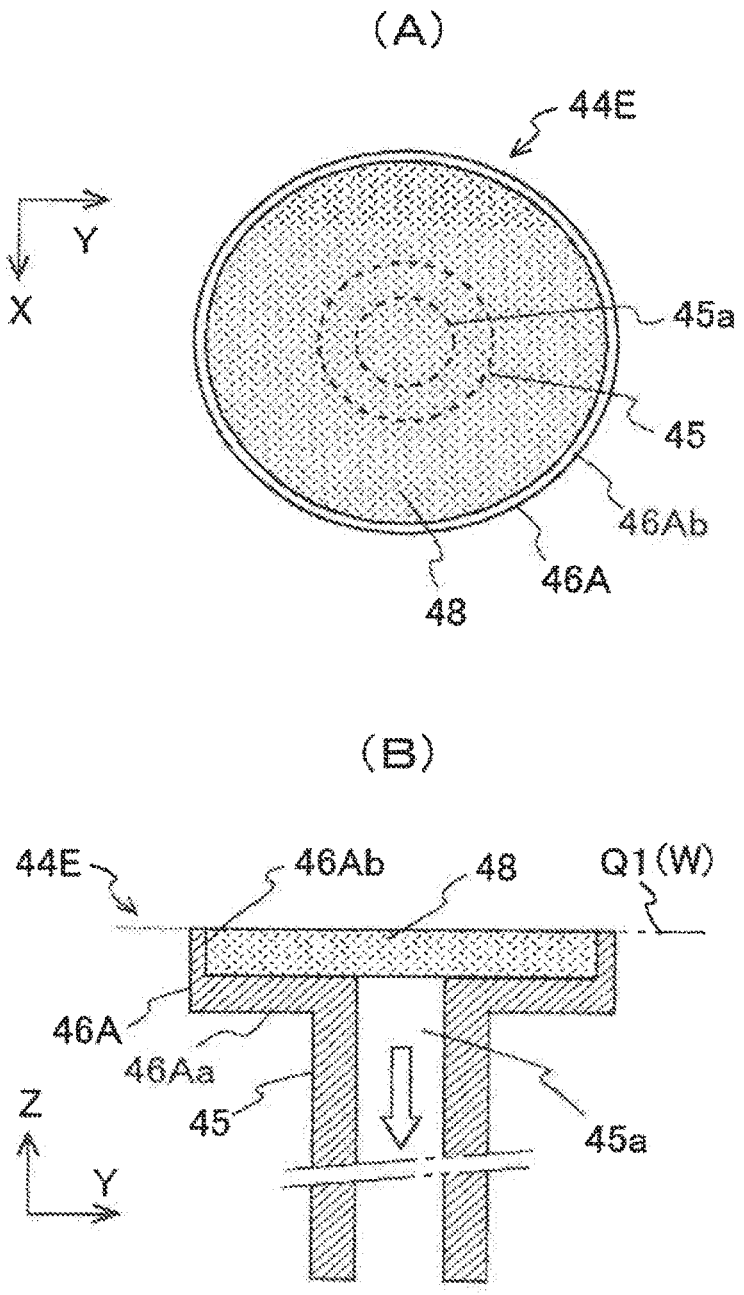

[FIG. 13]
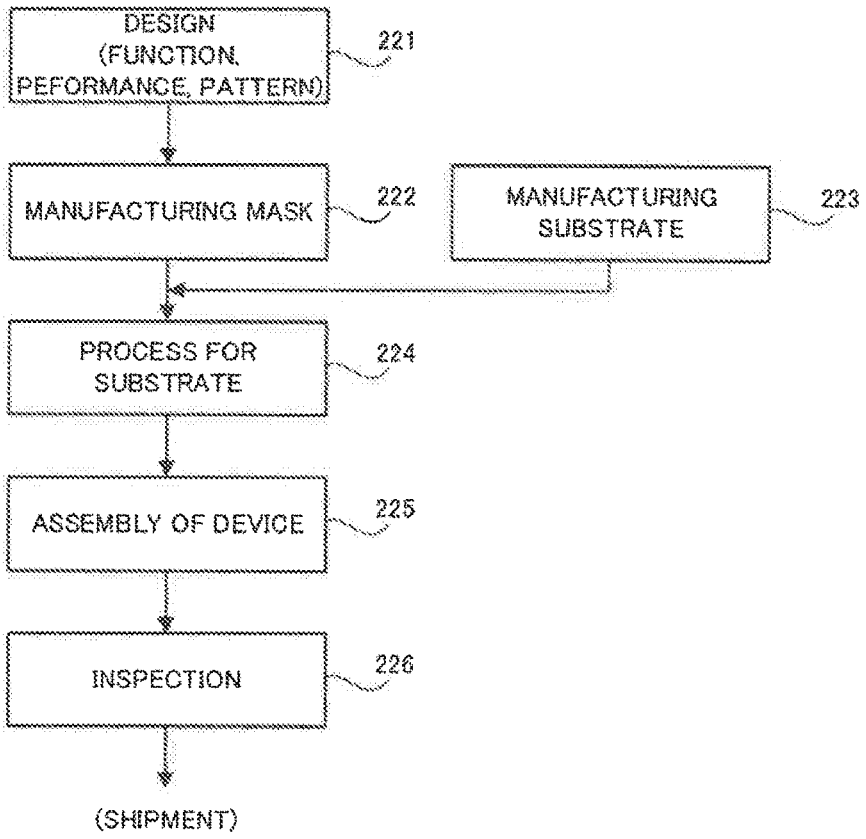

SUBSTRATE HOLDING METHOD, SUBSTRATE HOLDING APPARATUS, EXPOSURE APPARATUS AND EXPOSURE METHOD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

TECHNICAL HELD

The present invention relates to a substrate holding technology that holds a substrate, an exposure technology using this substrate holding technology and a device manufacturing technology using this exposure technology.

BACKGROUND ART

In order to hold a circular semiconductor wafer (hereinafter, it is referred to as a "wafer" simply) for example as a substrate that is an exposed target, what we call a pin-chuck type of wafer holder in which three lift pins (center pins) for example that is capable of being lifted up and down (going up and down) for carrying a wafer are disposed between many pin-shaped small protruding parts is used by an exposure apparatus such as what we call a stepper or a scanning stepper that is used in a photolithography process for manufacturing an electronic device (a micro device) such as a semiconductor element. Moreover, a SEMI standards (Semiconductor Equipment and Materials International standards) for a diameter of the wafer becomes larger at a rate of 1.25 times to 1.5 times per every several years to be 125 mm, 150 mm, 200 mm and then 300 mm.

The lift pin that is placed in the conventional wafer holder is a bar-shaped component in which a size of its tip part that contacts with the wafer is approximately same as a size of a lower part below the tip part, and an exhaust hole for vacuum suction using suction force that is generated at a negative pressure region is formed at a center portion thereof (for example, refer to a Patent Literature 1).

CITATION LIST

Patent Literature

Patent Literature 1: U.S. Pat. No. 6,590,633

SUMMARY OF INVENTION

Technical Problem

Recently, the SEMI standards proceeds with a standardization of the wafer having a diameter of 450 min to improve so throughput in manufacturing the electronic device. If the wafer becomes larger in this manner, the conventional method of simply allowing the bar-shaped three lift pins for holding the wafer to lift and carrying the wafer to a placement surface of the wafer holder (an upper surface of many protruding portions) may not generate adequate suction force to the wafer and may lead to local deformation (distortion) of the wafer at a position of the lift pin. If the wafer is locally distorted in this manner, residual distortion or the like of the wafer may lead to a partial gap (a space) between the wafer and the placement surface for the wafer. If there is the partial gap between the wafer and the placement surface for the wafer in this manner, flatness of an exposed region of the wafer may deteriorate and exposure accuracy (resolution or the like) may partially deteriorate.

An aspect of the present invention considers this condition and its object is to suppress the local deterioration of the flatness of a substrate in placing the substrate that is a held target at a target position even if the substrate is large.

Solution to Problem

According to a first aspect of the present invention, there is provided a substrate holding apparatus for holding a substrate, including: a substrate holding part on which the substrate is placed; and a supporting member that is configured to be lifted up and down with respect to the substrate bolding part, an end part of the supporting member including; a suction part that forms a suction region for sucking a rear surface of the substrate; and a supporting part that supports the rear surface of the substrate in the suction region.

According to a second aspect, there is provided a substrate holding apparatus for holding a substrate, including: a substrate holding part on which the substrate is placed; and a supporting member that is configured to be lifted up and down with respect to the substrate holding part, an end part of the supporting member including: a porous member that includes a space part and allows a pressure of at least one portion of the space part to be a negative pressure to suck a rear surface of the substrate; and a wall part that is formed to surround at least one portion of the porous member.

According to a third aspect, there is provided a substrate holding apparatus for holding a substrate, including: a substrate holding part on which the substrate is placed; and a supporting member that is configured to be lifted up with respect to the substrate holding part, an end part of the supporting member including: a ring-like first supporting part that supports a rear surface of the substrate; and a second supporting part that supports the rear surface of the substrate in a region surrounded by the first supporting part.

According to a fourth aspect, there is provided an exposure apparatus that projects pattern with exposure light and exposes a substrate with the exposure light via the pattern, including: the substrate holding apparatus in the aspect of the present invention for holding the substrate that is an exposed target; and a stage that moves with the substrate holding apparatus being placed thereon.

According to a fifth aspect, there is provided a substrate holding method that uses the substrate holding apparatus in the aspect of the present invention, including: moving the end part of the supporting member of the substrate holding apparatus to an upside of the substrate holding part; receiving the substrate at the end part of the supporting member; sucking the substrate by the suction part; lifting down the end part of the supporting member with respect to the substrate holding part; stopping the suction of the substrate by the suction part; and delivering the wafer from the end part of the supporting member to the substrate holding part.

According to a sixth aspect, there is provided an exposure method of projecting pattern with exposure light and exposing a substrate with the exposure light via the pattern, including: holding the substrate by using the substrate holding method in the aspect of the present invention; and moving the substrate to an exposure position.

According to a seventh aspect, there is provided a method of manufacturing device including: forming a pattern of a photosensitive layer on a substrate by using the exposure apparatus or the exposure method in the aspect of the present invention; and processing the substrate on which the pattern is formed.

Advantageous Effects of Invention

According to the aspects of the present invention, since the supporting parts that supports the rear surface of the substrate in the suction region, the porous member that sucks the rear surface of the substrate or the second supporting part that supports the rear surface of the substrate in the region surrounded by the ring-like first supporting part is placed at the end part of the supporting member, it is possible to prevent the local deformation of the wafer when the end part of the supporting member supports the substrate. Thus, when the substrate as a held target is placed on a target position, it is possible to prevent a local deterioration of flatness of the substrate even if the substrate is large.

BRIEF DESCRIPTION OF DRAWINGS

FIG. 1 is a diagram illustrating an outline of a structure of an exposure apparatus EX in a first embodiment.

FIG. 2 is a plan view illustrating a wafer stage in FIG. 1

FIG. 3 is a block diagram illustrating a control system and the like of the exposure apparatus in FIG. 1

FIG. 4(A) is a plan view illustrating a wafer holder apparatus in FIG. 1, and FIG. 4(B) is a diagram illustrating a cross-sectional view of FIG. 4(A) that is observed from the front and a control part.

FIG. 5(A) is an enlarged plan view illustrating a lift pin of the wafer holding apparatus, FIG. 5(B) is a vertical cross-sectional view illustrating the lift pin in FIG. 5(A) from which one portion is omitted, FIG. 5(C) is an enlarged plan view illustrating a lift pin in the modified example, and FIG. 5(D) is a vertical cross-sectional view illustrating the lift pin in another modified example from which one portion is omitted.

FIG. 6 is a flow chart illustrating one example of an exposure method including a method of holding the wafer.

FIG. 7(A) is a cross-sectional view illustrating a state where the wafer is carried to the lift pin, and FIG. 7(B) is a cross-sectional view illustrating a state where a center part of the wafer contacts with a wafer holder.

FIG. 8(A) is an enlarged cross-sectional view illustrating one portion of the wafer that is supported by the lid pin in the embodiment, and FIG. 8(B) is an enlarged cross-sectional view illustrating one portion of the wafer that is supported by the lift pin in the modified example.

FIG. 9 is a plan view illustrating a water holding apparatus in the modified example.

FIG. 10(A) is an enlarged plan view illustrating a lift pin in the modified example, FIG. 10(B) is a vertical crass-sectional view illustrating the lift pin in FIG. 10(A) from which one portion is omitted, FIG. 10(C) is an enlarged plan view illustrating a lift pin in another modified example, FIG. 10(D) is a vertical cross-sectional view illustrating the lift pin in FIG. 10(C) from which one portion is omitted, and FIG. 10(E) is an enlarged plan view illustrating a lift pin in additional another modified example.

FIG. 11(A) is an enlarged plan view illustrating a lift pin in another modified example, FIG. 11(B) is an enlarged plan view illustrating a lift pin in additional another modified example, and FIG. 11(C) is an enlarged plan view illustrating a lift pin in another modified example.

FIG. 12(A) is an enlarged plan view illustrating a lift pin in a second embodiment, and FIG. 12(B) is a vertical cross-sectional view illustrating the lift pin in FIG. 11(A) from which one portion is omitted.

FIG. 13 is a flowchart illustrating one example of a method for manufacturing an electronic device.

DESCRIPTION OF EMBODIMENTS

First Embodiment

With reference to FIG. 1 to FIG. 8(B), a first embodiment of the present invention will be explained. FIG. 1 illustrate an outline of a structure of an exposure apparatus EX that includes a wafer holding apparatus (a substrate holding apparatus) in the present embodiment. The exposure apparatus EX is a scan-exposure type of projection exposure apparatus that includes scanning stepper (a scanner). The exposure apparatus EX includes a projection optical system PL (a projection unit PU). Hereinafter, the embodiment will be explained under the condition where a Z axis is set to he parallel to an optical axis AX of the projection optical system PL, a Y axis is set to be along a direction in which a scanning of a reticle R relative to a wafer (a semiconductor wafer) W is performed in a surface that is perpendicular to the Z axis, and a X axis is set to be along a direction that is perpendicular to the Z axis and the Y axis. Moreover, rotational directions around axes that are parallel to the X axis, the Y axis and the Z axis respectively are referred to as a θX direction, a θY direction and a θZ direction, respectively. In the present embodiment, a plane (a XY plane) that is perpendicular to the Z axis is approximately parallel to a horizontal plane, and −Z direction is a direction of an approximately vertical line.

The exposure apparatus EX includes: an illumination system ILS that is disclosed in United States Patent Application Publication No. 2003/0025890 for example; and a reticle state RST that holds the reticle R (a mask) that is illuminated by illumination light (exposure light) IL for exposure (for example, ArF excimer laser light having wavelength of 193 nm, harmonic wave of solid-state laser (semiconductor laser or the like) or the like) from the illumination system ILS. Moreover, the exposure apparatus EX includes: the projection unit PU including the projection optical system PL that exposes the wafer W (a substrate) with the illumination light IL emitted from the reticle R; a wafer holding apparatus 8 that holds the wafer W (refer to FIG. 3); a wafer stage WST that moves while supporting a mechanical unit of the wafer holding apparatus 8; and a control system and the like (see FIG. 3).

The reticle R is held on an upper surface of the reticle stage RST by vacuum suction or the like and circuit pattern and the like is formed on a pattern surface (a lower surface) of the reticle R. The reticle stage RST is finely movable in the XY plane on a not-illustrated reticle base by a reticle stage driving system 25 in FIG. 3 including a linear motor or the like for example, and is movable at a designated scan speed in a scan direction (a Y direction).

Position information (including positions in a X direction and the Y direction and rotational angle in the OZ direction) of the reticle stage RST in a moving surface is continuously detected by a reticle interferometer 24 including a reticle interferometer via a movable mirror 22 (or end surface of the stage that is mirror-polished) with a resolution of 0.5 nm to 0.1 nm, for example. The detected value of the reticle interferometer 24 is outputted to a main control apparatus 20 including a computer in FIG. 3. The main control apparatus 20 controls the reticle stage driving system 25 on the basis of the detected value and thus controls the position and speed of the reticle stage RST.

In FIG. 1, the projection unit PU that is placed below the reticle stage RST includes: lens barrel 40; and the projection optical system PL having a plurality of optical elements that are held to have a predetermined positional relationship in the lens barrel 40. A planar frame (hereinafter, it is referred to as a "measurement frame") 16 is supported by a not-illustrated frame body via a plurality of vibration isolating apparatuses (not illustrated), and the projection unit PL is placed in an opening that is formed at the measurement frame 16 via a flange part FL. The projection optical system PL is a both-sides telecentric system and has a predetermined projection magnification β (for example, a reduction magnification such as ¼ times, ⅕ times or the like).

When a illumination region IAR of the reticle R is to illuminated with the illumination light IL from the illumination system ILS, the illumination light IL that passes through the reticle R generates an image of the circuit pattern in the illumination region IAR at an exposed region IA (a region that is conjugate to the illumination region IAR) in one shot region of the wafer W via the projection optical system PL. The wafer W includes, as one example, a large circular base material that includes the semiconductor such as a silicon and has a diameter of 300 mm, 450 mm or the like and on which photoresist (photosensitive material) having a thickness of tens of nanometer to 200 nm is coated. A thickness of the base material having the diameter of 300 mm is 775 μm, for example. A thickness of the base material having the diameter of 450 mm is 900 μm to 1100 μm (for example, about 925 μm) at present, for example.

Moreover, in order to allow the exposure apparatus EX to expose by using liquid immersion method, a nozzle unit 32 that is one portion of a local liquid immersion apparatus 38 is placed to surround a lower end part of the lens barrel 40 holding a front end lens that is the optical element being closest to an image plane (the wafer W) and constituting the projection optical system PL. The nozzle unit 32 is coupled to a liquid supply apparatus 34 and a liquid recovery apparatus 36 (refer to FIG. 3) via a supply pipe 31A that is for supplying liquid Lq (for example, purified water) for the exposure and a recovery pipe 31B. Incidentally, if the liquid immersion type of exposure apparatus is not used, the above described local liquid immersion apparatus 38 may not be provided.

Moreover, the exposure apparatus EX includes: a special image measurement system (not illustrated) that measures a position of an image of an alignment mark (a reticle mark) of the reticle R generated by the projection optical system PL to align the reticle R; an image processing type (PIA system) of alignment system AL, for example, that is used to align the wafer W; an oblique incident type of automatic focusing sensor (hereinafter, it is referred to as a "multipoint AF system") 90 (refer to FIG. 3) for multipoint that includes an light emitting system 90a and a light detecting system 90b and that measures Z positions of plurality of parts of a front surface of the wafer W; and an encoder 6 (refer to FIG. 3) that is to measure position information of the wafer stage WST. The special image measurement system is placed in the wafer stage WST, for example.

The alignment system AL includes five alignment systems ALc, ALb, ALa, Ald and ALe that are placed at approximate equal intervals along the X direction (non-scan direction) in a region that is placed to be away from the projection optical system PL in −Y direction and whose length is about the diameter of the wafer W, as illustrated in FIG. 2 as one example. The alignment system AL is configured to simultaneously detect wafer marks at different positions on the wafer W by using five alignment systems ALa to ALe. Moreover, a loading position LP that corresponds to a center position of the wafer stage WST when the wafer W is loaded and an unloading position UP that corresponds to the center position of the wafer stage WST when the wafer W is unloaded are respectively set at positions that are away from the alignment systems ALa to ALe in −Y direction and that are respectively shifted in −X direction and +X direction. A wafer carriage robot WLD (refer to FIG. 1) that loads the wafer W is placed near the loading position LP and a wafer carriage robot (not illustrated) that unloads the wafer W is placed near the unloading position UP.

Moreover, in FIG. 2, the light emitting system 90a and the light detecting system 90b of the multipoint AF system 90 are placed along a region that is between the alignment systems ALa to ALe and the projection optical system PL, for example. According to this arrangement, the wafer stage WST is driven to move the wafer W in the Y direction to an exposure start position that is below the projection optical system PL after the wafer W is loaded on the wafer stage WST, and thus the multipoint AF system 90 is capable of efficiently measuring a distribution of the Z positions of the front surface of the wafer W and the alignment systems ALa to ALe is capable of efficiently measuring the positions of the plurality of wafer marks (mark or the like that is formed in each shot region of the wafer W). A measurement result of the multipoint AF system 90 and a measurement result of the alignment system AL are outputted to the main control apparatus 20.

In FIG. 1, the wafer stage WST is supported in a non-contact manner by an upper surface WBa that is parallel to a XY surface of a base plate WB via a plurality of non-illustrated vacuum pre-loadable pneumatic static pressure bearings (air pads). The wafer stage WST is movable in the X direction and the Y direction by a stage driving system 18 (refer to FIG. 3) including a planar motor or two pairs of linear motors that are orthogonal to each other, for example. The wafer stage WST includes: a stage body 30 which is moved in the X direction and the Y direction; a wafer table WTB that is placed, as a Z stage, on the stage body 30; and a Z stage driving unit that is placed in the stage body 30 and that finely adjusts the Z position and tilt angles in the θX direction and the θY direction of the wafer table WTB relative to the stage body 30. A wafer holder 54 that holds the wafer W by vacuum suction or the like on a placement surface that is approximately parallel to the XY surface is placed inside an opening placed at a center of the wafer table WTB. The mechanical unit 50 (refer le FIG. 3) of the wafer holding apparatus 8 is configured to include the wafer holder 54. Incidentally, the water stage body 30 itself may be configured to move as a six degrees of freedom stage (in X, Y, Z, θX, θY and θZ. directions) by the planar motor or the like.

Moreover, plate-shaped plate body 28 having high flatness is placed on an upper surface of the wafer table WTB, the plate body 28 has a surface that is subjected to the liquid-repellent process for the liquid Lq and that is at the same level as the front surface of the wafer W, an outer shape (a contour) of the plate body 28 is rectangular and a circular opening that is larger than a placement region for the wafer W is formed at a center position of the plate body 28.

Incidentally, in what we call the liquid immersion type of exposure apparatus including the above described local liquid immersion apparatus 38, as illustrated in a plane view of the wafer stage WST in FIG. 2, the plate body 28 further includes: a plate part (liquid repellent plate) 28b that surrounds the circular opening 28a, that has a rectangular outer shape and that has a surface being subjected to the liquid-repellent process; and a periphery part 28c that surrounds the plate part 28b. One pair of two-dimensional diffraction gratings 12A and 12B and one pair of two-dimensional diffraction gratings 12C and 12D are placed on an upper surface of the periphery part 28c. The pair of two-dimensional diffraction gratings 12A and 12B is elongated in the X direction to sandwich the plate part 28b in the Y axis direction. The pair of two-dimensional diffraction gratings 12C and 12D is elongated in the Y direction to sandwich the plate part 28b in the X axis direction. Each of the diffraction gratings 12A to 12D is a reflective type of diffraction grating having a two-dimensional grating pattern whose periodical direction is the X direction and the Y direction and whose cycle is about 1 μm.

In FIG. 1, a plurality of three-axis detection heads 14 that irradiate the diffraction gratings 12C and 12D with laser light (measurement light) for the measurement and that measure a relative (three-dimensional) position relative to the diffraction grating in the X direction, the Y direction and the Z direction are placed on a bottom surface of the measurement frame 16 to sandwich the projection optical system PL in the X direction (refer to FIG. 2). Moreover, a plurality of three-axis detection heads 14 that irradiate the diffraction gratings 12A and 12B with the laser light for the measurement and that measure the relative three-dimensional position relative to the diffraction grating are placed on the bottom surface of the measurement frame 16 to sandwich the projection optical system PL in the Y direction (refer to FIG. 2). Moreover, there are also provided one laser source or a plurality of laser sources (not illustrated) for supplying the laser light (the measurement light and reference light) to the plurality of detection heads 14.

In FIG. 2, during a period during which the wafer W is exposed via the projection optical system PL, two detection heads 14 in a row A1 in the Y direction irradiate the diffraction grating 12A or 12B with the measurement light and supplies to a respective one measurement processing unit 42 (refer to FIG. 3) detection signal of interfering light generated by interference between the reference light and diffracted light generated from the diffraction gratings 12A and 12B. In parallel to this, two detection heads 14 in a row A2 in the X direction irradiate the diffraction grating 12C or 12D with the measurement light and supplies to a respective one measurement processing unit 42 (refer to FIG. 3) detection signal of interfering light generated by interference between the reference light and diffracted light generated from the diffraction gratings 12C and 12D. These measurement processing units 42 for the detection heads 14 in the row A1 and the row A2 calculate the relative positions (relative movement amounts) in the X direction, the Y direction and the Z direction of the wafer stage WST (the wafer W) relative to the measurement frame 16 (the projection optical system PL) at a resolution of 0.5 nm to 0.1 nm for example, and supply the calculated value to a switching unit 80A and a switching unit 80B. The switching units 80A and 80B for the calculated value supply to the main control apparatus 20 information of the relative positions that are supplied from the measurement processing units 42 corresponding to the detection heads 14 that face the diffraction gratings 12A to 12D.

The three-axis encoder 6 is constructed of the plurality of detection heads 14 in the row A1 and the row A2, the laser source (not illustrated), the plurality of measurement processing units 42, the switching units 80A and 80B and the diffraction gratings 12A to 12D. A detailed structure of each of this encoder and five alignment systems are disclosed in United States Patent Application Publication No. 2008/094593, for example. The main control apparatus 20 obtains information relating to positions in the X direction, the Y direction and the Z direction and the rotational angle in the OZ direction and the like of the wafer stage WST (the wafer W) relative to the measurement frame 16 (the projection optical system PL) on the basis of information of the relative positions that are supplied from the encoder 6 and moves the wafer stage WST on the basis of this information by using the stage driving system 18.

Incidentally, a laser interferometer that measures the three-dimensional position of the wafer stage WST may he provided in addition to or instead of the encoder 6 and the wafer stage WST may be moved by using the measurement value of the laser interferometer.

When the exposure apparatus EX performs the exposure, the reticle R and the wafer W are aligned firstly as a basic operation. Then, the image of the pattern of the reticle R is transferred onto one shot region by starting to illuminate the reticle R with the illumination light IL and performing a scanning exposure operation that projects the image of one portion of the pattern of the reticle R on one shot region on the front surface of the wafer W via the projection optical system while synchronously moving (synchronously scanning) the reticle stage RST and the wafer stage WST in the Y direction with the projection magnitude β of the projection optical system PL being set as a speed ratio. Then, an operation (a step movement operation) that moves the wafer W in the X direction and the Y direction via the wafer stage WST and the above described scanning exposure operation are repeated and thus the image of the pattern is transferred onto all shot regions of the wafer W by a step-and-scan method and the liquid immersion method.

At this time, optical path lengths of the measurement light and the diffracted light in each detection head 14 of the encoder 6 are shorter than that of the laser interferometer. Thus, the image of the pattern of the reticle R can be transferred onto the wafer W highly precisely. Incidentally, in the present embodiment, the detection heads 14 are placed at a side of the measurement frame 16 and the diffraction gratings 12A to 12D are placed at a side of the wafer stage WST. As another structure, the diffraction gratings 12A to 12D may be placed at the side of the measurement frame 16 and the detection heads 14 may be placed at the side of the wafer stage WST Next, the structure and the operation of the wafer holding apparatus 8 in the present embodiment will be explained in detail. The wafer holding apparatus 8 includes: the mechanical unit 50 including the wafer holder 54 that is placed in the wafer stage WST; and a wafer holder control system 51 that controls an operation of the mechanical unit 50 under the control of the main control apparatus 20.

FIG. 4(A) is a plan view illustrating the wafer holder apparatus 8 in FIG. 1. FIG. 4(B) illustrates a vertical cross-sectional view (a cross-sectional view that is observed from the front) of a center portion of FIG. 4(A) in the X direction and the wafer holder control system 51. In FIG. 4(B), the Z stage 53 that is made of a metal having a low expansion rate, for example, is supported on an upper surface of the stage body 30 via driving units (not illustrated) at three positions each of which uses a voice coil motor method, for example, and allows the movement in Z direction. The stage 53 corresponds to the wafer table WTB FIG. 1.

The Z stage 53 is a rectangular box-shaped member whose upper part is opened. The wafer holder 54 is fixed at an inner surface 53a that is approximately parallel to the XY plane and is in a concaved part at center of the Z stage 53. The wafer W is held by the wafer holder 54. The diffraction gratings 12A to 12D are fixed at an upper surface of a side wall part of the Z stage 53 via the plate body 28.

Moreover, a bottom part of the wafer holder 54 has a circular and planar plate-like shape. A side wall part 54c that has a closed ring-like shape is integrally formed on an upper surface of the bottom part. A size of the aide wall part 54c is slightly smaller than an edge part of a periphery of the wafer W that is a held target. The side wall part 54c supports a periphery part of the wafer W. If the diameter of the wafer W is 300 mm or 450 mm, the side wall part 54c is formed so that its outer diameter is slightly smaller than 300 mm or 450 mm. The wafer holder 54 is made of a material having a very low thermal expansion rate, for example, as one example. A super low expansion glass (for example, ULE (a trade name) of Corning company), a glass-ceramic having a super low expansion rate (for example, Zerodur (a trade name) of Schott company), a silicon carbide (SiC) or the like can be used as this material.

Moreover, as illustrated in FIG. 4(A), a plurality of pin-shaped protruding parts 54b are integrally formed at positions corresponding to grid points of two-dimensional grid having an equilateral-triangular shape as a basic shape, for example, in a region that is surrounded by the side wall part 54c on the bottom part of the wafer holder 54. A distance between plural adjacent protruding parts 54b is several mm (for example, about 3 mm), for example. Upper surfaces of the plurality of protruding parts 54b and the side wall part 54c are processed to have an extremely high flatness to contact with same plane (approximately, the XY plane). A surface including the upper surfaces of the plurality of protruding parts 54b and the side wall part 54c corresponds to the placement surface 54a for the wafer W. The wafer W that is the exposed target is placed on the placement surface 54a so that a gap between a rear surface of the wafer W and the upper surfaces of the plurality of protruding parts 54b and the side wall part 54c is not generated as much as possible. The wafer holder 54 can be manufactured by performing an integral molding and then a polishing and the like of front surfaces of the protruding parts 54b and the like, for example. Incidentally, for the simple illustration, FIG. 4(a) illustrates the wafer W by two-dot chain line.

Moreover, a suction hole 55A is formed at an approximate center of a region that is surrounded by the side wall part 54c on an upper surface of the wafer holder 54. A plurality of first surrounding suction holes 55B are formed at approximate equal angle intervals along a first circumference C1 that surrounds the suction hole 55A. A plurality of second surrounding suction holes 55C are formed at approximate equal angle intervals along a second circumference C2 that surrounds the suction hole 55A at the center and that is larger than the first circumference C1. A plurality of third surrounding suction holes 55D are formed at approximate equal angle intervals along a third circumference C3 that surrounds the suction hole 55A at the center and that is larger than the second circumference C2. The suction holes 55A to 55D are formed in a region between the plurality of protruding parts 54b. Incidentally, the suction holes 55A at the center or at the vicinity of the center may not be necessarily formed.

In the present embodiment, the number of each of the first to third surrounding suction holes 55B to 55D is preferably larger than six, in order to suck the rear surface of the wafer W at the placement surface 54a more uniformly and stably. However, the number of each of the first to third surrounding suction holes 55B to 55D may be any number. The numbers of the first to third surrounding suction holes 55B to 55D may be different from one another. As illustrated in FIG. 4(b), the suction holes 55A, 55B, 55C and 55D communicate with exhaust pipes 61B1, 61B2, 61B3 and 61B4 that are placed inside the stage body 30 via exhaust passages a1 and a2 and the like that are independent from one another and that are inside the bottom part of the wafer holder 54 and exhaust passages a11, a21, a31 and a41 that are independent from one another and that are inside the Z stage 53, respectively. The exhaust pipes 61B1 to 61B4 are coupled to a vacuum pump 62 that is outside the wafer stage WST via an exhaust pipe 61A having flexibility.

Valves (hereinafter, each is referred to as a "suction valve") V11, V12, V13 and V14 that are to start the vacuum suction and valves (hereinafter, each is referred to as a "suction stop valve") V21, V22, V23 and V24 that are to allow the insides of the exhaust pipes 61B1 to 61B4 to communicate with air to stop the vacuum suction are attached to the exhaust pipes 61B1, 61B2, 61B3 and 61B4, respectively. The wafer holder control system 51 controls the opening and the closing of each of the valves V11 to V14 and the valves V21 to V24. The bottom part of the wafer holder 54 at which the plurality of suction holes 55A to 55D are formed, the exhaust pipes 61A and 61B1 to 61B4 and the vacuum pump 62 constitute a suction unit (a second suction part) for the wafer holder 54 that holds the wafer W at the placement surface 54a of the wafer holder 54 by the vacuum suction. This suction unit is one portion of entire suction unit 52. In the present embodiment, the wafer holder control system 51 is capable of controlling timings for the vacuum suction of the wafer W and for the stop of the vacuum suction via the suction holes 55A to 55D independently of one another. Incidentally, the vacuum suction of the wafer W and the stop of the vacuum suction via the suction holes 55A to 55D may he synchronously performed at the same timing.

Moreover, a plurality of members (hereinafter, each is referred to as a "lift pin") each of which elongates in the Z direction and can be lifted up and down (go up and down) in the Z direction while holding the wafer W by the vacuum suction are placed at approximate equal angle intervals along a circumference CT between the first circumference C1 and the second circumference C2 in the region of the wafer holder 54 that is surrounded by the side wall part 54c, for example. Incidentally, the lift pin 44 are placed near the center of the wafer holder 54 and thus the lift pin 44 can be referred to as a center pin or an up-and-down pin. At least three lift pins 44 are preferably placed to stably support the wafer W. However, the number of the lift pins 44 is not limited to this number. The number of the lift pins 44 may be larger or smaller than three, for example. Moreover, the number of the lift pins 44 may he an integral multiple of three such as six or nine, for example. In the present embodiment, three lift pins 44 are placed at a positions P1, P2 and P3 that are arranged at approximate equal angle intervals along the circumference CT, respectively. FIG. 4(B) illustrates the lift pins 44 in the positions P1 and P3.

If the diameter of the wafer W is 450 mm, a diameter of the circumference CT along which the plurality of lift pins 44 are placed is preferably 180 mm to 350 mm (⅔ times to ⅞ times of the diameter of the wafer W), for example, to stably support the wafer W by the plurality of lift pins 44. If the diameter of the wafer W is 450 mm, the diameter of the circumference CT may be set about 200 mm, for example.

Moreover, the diameter of the circumference CT along which the lift pins 44 are placed may be set so that deflection amount of the wafer W is minimized when the plurality of lift pins 44 support the wafer W, namely, so that the wafer W is supported at positions that correspond to what we call Bessel points. The diameter of the circumference CT representing the positions that correspond to the Bessel points in the case where the diameter of the wafer W is 450 mm is about 280 mm to 310 mm.

The lift pin 44 includes: an axis part 45 that has an elongated and cylindrical (bar-like) external appearance and that is inserted in an opening formed in the wafer holder 54 and the Z stage 53; and a tip part 46 that is coupled to an upper end of the axis part 45 and that faces the wafer W as the held target to support the wafer W, for example. A suction hole (passage) 45a is formed in a center of the axis part 45. The suction hole 45a includes a circular through hole for forming a negative pressure space that causes suction force (attracting force) in vacuum-sucking the wafer W. An outer shape of the tip part 46 is a circular dish-like shape having a diameter that is larger than a diameter of the axis part 45, for example, and a center part of the tip part 46 communicates with the suction hole 45a. A circular cut part (a counter boring part) 54d (refer to FIG. 7(A)) having a size and depth that allows the tip part 46 to be in it is formed at a position that is on the surface of the wafer holder 54 at which the plurality of protruding part 54b are formed and that has the opening through which the axis part 45 of the lift pin 44 passes. When the wafer W is placed on the placement surface 54a of the wafer holder 54 on the plurality of protruding part 54b and the wafer W is exposed, the axis parts 45 of the plurality of lift pills 44 are down toward −Z direction and one portion of the tip part 46 is in the cut part 54d of the wafer holder 54 (in a position that is below the protruding parts 54d in the Z direction). Thus, even if a size (thickness) of the tip part 46 in the Z direction is larger than a size (a thickness) of the protruding part 54b in the Z direction, the tip part 46 is capable of certainly moving to a position (cut part 54d) that is away from the wafer W. However, if the size of the tip part 46 in the Z direction is smaller than the size (the thickness) of the protruding part 54b in the Z direction, the cm part 54b may not be necessarily formed.

Moreover, in FIG. 4(B), each of the suction holes 45a in the axis parts 45 of the plurality of lift pins 44 communicates with an exhaust pipe 61A having flexibility via an exhaust pipe 60 having flexibility in the stage body 30 and a fixed exhaust pipe 61C. The exhaust pipe 61A communicates with the vacuum pump 62. The suction hole of the lift pin 44 at the position P2 in FIG. 4(A) also communicates with the exhaust pipe 61C. A suction valve V3 that is to start the vacuum suction by the lift pins 44 and a suction stop valve V4 that is to stop the vacuum suction are attached to the exhaust pipe 61C. The wafer holder control system 51 controls the opening and the closing of each of the valves V3 and V4. The exhaust pipes 60 and 61C, the valves V3 and V4 and the vacuum pump 62 constitute a suction unit (a first suction part) that holds the wafer W at the tip parts 46 of the plurality of lift pins 44 by the vacuum suction. This suction unit is one portion of entire suction unit 52. Incidentally, a plurality of vacuum pumps may be provided and the first and second suction units may he coupled to the vacuum pumps, respectively and independently from each other. In the present embodiment, the first to third surrounding suction holes 55B to 55D are placed at positions having approximate same angle in the circumferential direction. The plurality of lift pins 44 are placed along the circumferential direction between the plurality of suction holes 55B and 55C.

Moreover, the axis part 45 and the tip part 46 of the lift pin 44 are integrally formed as one example, however, the axis part 45 and the tip part 46 may be coupled to each other by bond or the like after the axis part 45 and the tip part 46 are formed separately. The lift pin 44 can be formed of the material having a very low thermal expansion rate such as the silicon carbide (SiC), a ceramic made of the silicon carbide, the super low expansion glass or the glass-ceramic having a super low expansion rate, for example, as with the wafer holder 54.

As illustrated in FIG. 4(B), each of the axis parts 45 of the plurality of lift pins 44 is lifted up and down (goes up and down) with respect to the wafer holder 54 in the Z direction by a driving unit 56 that is placed at a side of a bottom surface of the Z stage 53. A driving mechanism using a voice coil motor method, a rack and pinion method or the like can be used as the driving unit 56. Moreover, position sensors 57 such as optical linear encoders or the like, for example, are placed. The position sensors 57 measure positions of the axis parts 45 of the plurality of lift pins 44 in the Z direction separately. The measured values by the position sensors 57 for the plurality of lift pins 44 are supplied to the wafer holder control system 51. The wafer holder control system 51 separately controls each of the positions of the plurality of lift pins 44 in the Z direction via respective one driving unit 56 on the basis of the measurement result of the plurality of position sensors 57.

Moreover, if the tip part 46 of the lift pin 44 contacts with the rear surface of the wafer W when the lift pin 44 is being lifted up, driving force of corresponding one driving unit 56 increases and driving current increases, for example. Thus, the wafer holder control system 51 monitors the driving currents of the driving units 56 and thus is capable of determining whether the lift pin 44 contacts with the wafer W on the basis of the variation of the driving currents, for example. Incidentally, the plurality of lift pins 44 are synchronously moved in the Z direction to be at the same height, however, the plurality of lift pins may be lifted up and down by one driving unit, for example. The wafer holder 54, the plurality of lift pins 44, the driving units 56 for these and the suction unit 52 constitute the mechanical unit 50 (refer to FIG. 3) of the wafer holding apparatus 8.

Next, with reference to FIG. 5(A) to FIG. 5(D), the lift pin 44 of the wafer holding apparatus 8 in the present embodiment will he explained in detail. In the below explanation relating to the lift pin 44, the diameter of the wafer W that is the held target is regarded as 450 mm.

FIG. 5(A) is an enlarged plan view illustrating the lift pin 44 in FIG. 4(B). FIG. 5(B) is a vertical cross-sectional view illustrating the lift pin 44 in FIG. 5(A) from which one portion of the axis part 45 is omitted.

As illustrated in FIG. 5(A) and FIG. 5(B), the tip part 46 that is placed at the upper end of the axis part 45 of the lift pin 44 includes: a circular-disk-shaped bottom part 46a having an opening (this is also referred to as the "suction hole 45a") communicating with the suction hole 45a in the axis part 45; a convex and circular wall part 46b that is placed at a periphery of the bottom part 46a; and a plurality of convex parts 46c that are formed in a suction region 46s on an upper surface of the bottom part 46a surrounded by the wall part 46b and that are formed in a region outside the suction hole 45a. The plurality of convex parts 46c have truncated conical shapes that are same as each other, for example. Thus, even if the convex parts 46c repeatedly contact with the wafer, the convex parts 46c do not deform.

Moreover, as illustrated in FIG. 5(A), the plurality of convex parts 46c are arranged along a first circumference and a second circumference whose centers correspond to the circular suction hole 45a. Incidentally, the plurality of convex parts 46c may be firmed along one circumference that surrounds the suction hole 45a, and moreover, may be formed along three or more circumferences that surround the suction hole 45a.

Moreover, upper surfaces of the plurality of convex parts 46c and an upper surface of the wall part 46b at the tip part 46 are processed to have high flatness to contact with same plane (virtual plane) Q1.

For example, an outer shape of the wall part 46b of the tip part 46 is preferably a circular shape having a diameter φ3 (refer to FIG. 5(A)) of 5 mm to 15 mm and width (thickness) t1 (refer to FIG. 5(B) of the wall part 46b is preferably 0.05 mm to 0.6 mm. Moreover, the diameter φ3 of the outer shape of the wall part 46b is more preferably 6 mm to 9 mm. In this case, a shape of a tip of each of the plurality of convex parts 46c is preferably a circular shape having a diameter φ4 (refer to FIG. 5(B)) of 0.05 mm to 0.6 mm. Moreover, height h1 (refer to FIG. 5(B) of each of the wall part 46b and the convex parts 46c is preferably 20 μm to 500 μm.

Moreover, a cross-sectional area of the axis part 45 is set to be smaller than a cross-sectional area of the outer shape of the wall part 46b of the tip part 46. If the shape of the wall part 46b is the circular shape having the diameter φ3 of 5 mm to 15 mm, an outer shape of the axis part 45 is a circular shape having a diameter φ2 (refer to FIG. 5(B)) of 3 mm to 5 mm and a shape of the suction hole 45a is a circular shape having a diameter φ1 (refer to FIG. 5(B)) of 1 mm to 2 mm. For example, if the diameter of the outer shape of the wall part 46b is about 8 mm, the diameter of the outer shape of the axis part 45 may be about 5 mm. Incidentally, the outer shape of the axis part 45 may be a polygonal shape or the like having a cross-sectional area that is close to that of the circle having the diameter φ2. Similarly, the outer shape of the wall part 46b may be also a polygonal shape or the like having a cross-sectional area that is close to that of the circle having the diameter φ3. The lift pin 44 having this tip part 46 can he manufactured by molding a material and then polishing the upper surfaces of the wall part 46b and the convex parts 46c, for example. Moreover, the wall part 46b and the convex parts 46c at the tip part 46 of the lift pin 44 may be formed by etching or CVD.

Moreover, in the present embodiment, since the rear surface of the wafer W is sucked and supported by the lift pins 44, a part (a front surface) of the tip part 46 of each lift pin 44 that contacts with the wafer W is preferably slippery in order to prevent a local deformation such as warp, curve or the like of the wafer W supported by the lift pins 44. For this purpose, the front surface of the tip part 46 of each lift pin 44 is subjected to a process for reducing friction. The process on the front surface for reducing the friction includes, as one example, a forming of a DLC (Diamond Like Carbon) film.

Incidentally, the arrangement of the plurality of convex parts 46c at the tip part 46 is not limited to the arrangement along the circumference. As illustrated by the lift pins 44 in FIG. 5(C), the convex parts 46 may be placed at grid points of two-dimensional grid having an equilateral-triangular shape (a square shape may be used) as a basic shape, for example, respectively. The plurality of convex parts 46c may be placed randomly, Moreover, as illustrated by convex parts 46d of the lift pin 44B in FIG. 5(D), the shape of each of the plurality of convex parts of the lift pin that contact with the wafer W may be a truncated conical shape having two (three or more) steps. The height of this convex part 46d is preferably 50 μm to 500 μm, for example. Moreover, the convex part 46c may not be solid and may has a tube-like shape (alternatively, pipe-like shape), for example. In this case, an upper end of the convex part has a ring-like shape surrounding the opening, for example, and the ring-like-shaped part contacts with the rear surface of the wafer. Moreover, an inside of the tube (the pipe) may he allowed to communicate with the opening at the bottom part as a passage and thus the wafer may he sucked by the tip of the convex part 46c.

Moreover, as illustrated by the lift pin 44B in FIG. 5(D), the height of the wall part 46b at the tip part 46 may be lower by gap δ than the height of the convex part 46d (a height of plane Q1). The gap δ is 50 nm to several micrometer, for example. if the height of the wall part 46b is lower than the height of the convex part 46d, air flows through a gap between the wall part 46b and the wafer W when the suction hole 45a sucks the air and thus the wafer W can be stably sucked by Bernoulli effect in some cases. Moreover, the height of not entire circumference of the wall part 46b but one portion thereof may be lower than the height of the convex part 46d (the height of the plane Q1).

Next, with reference to a flowchart in FIG. 6, one example of a holding method of holding the wafer by using the wafer holding apparatus 8 and an exposure method using this holding method in the exposure apparatus EX in the present embodiment will be explained. The operation in this method is controlled by the main control apparatus 20 and the wafer holder control system 51. Firstly, the reticle R is loaded on the reticle stage RST in FIG. 1 and the reticle R is aligned at step 102 in FIG. 6. Then, the wafer stage WST moves to the loading position LP in FIG. 2 wider the condition where the wafer W is not loaded, and the wafer carriage robot WLD (a wafer loading system) in FIG. 1 carries the nova-exposed and resist-coated wafer Won the wafer stage WST (step 104). At this time, the wafer W that is placed at a folk type of wafer arm (not illustrated) at a tip part of the wafer carriage robot WLD moves above the wafer holder 54 that is fixed to the wafer stage WST. At this state, the suction unit 52 of the wafer holding apparatus 8 stops the suction (including the suction by the lift pins 44) and the tip parts 46 of the lift pins 44 are located below the wafer W.

Then, as illustrated in FIG. 7(A), the wafer holder control system 51 starts the vacuum suction operation by the suction holes 45a while synchronously lifting up (moving toward +Z direction) all lift pins 44. After tips (the upper surface of the tip part 46) of the lift pins 44 contact with the rear surface of the wafer W, the lift pins 44 are slightly lifted up and then stop (step 106). At this time, the wafer W is sucked by the tips of the lift pins 44 and the position of the wafer W relative to the lift pins 44 does not change. At this time, the wafer W is carried from the wafer arm to the lift pins 44. Under this condition, the wafer arm moves toward −Y direction (step 110).

Then, all lift pins 44 are synchronously lifted down at same speed under the condition where the wafer W is supported (step 112), Then, as illustrated in FIG. 7(B), the suction unit 52 starts the vacuum suction via the suction holes 55A to 55D of the wafer holder 54 when the tips (the upper surfaces of the tip parts 46) of the lift pins 44 are close to the placement surface 54a, and the suction of the wafer W by the lift pins 44 stops when the tips of the lift pins 44 reach the placement surface 54a (step 114). The lift pins 44 stop at a position at which the tip parts 46 are below the placement surface 54a (at which the tip parts 46 are in the cut parts 54d). Then, as illustrated in FIG. 5(B), the rear surface of the wafer W is placed on the placement surface 54a of the wafer holder 54 and the wafer W is carried from the lift pins 44 to the wafer holder 54 (step 116).

At this time, the suction of the wafer by the suction hole 55A at the center of the wafer holder 54 may be performed and then the suction of the wafer by the surrounding suction holes 55B, 55C and 55D may be sequentially performed to gradually expand an area at which the suction is performed. For this operation, even if the wafer W is large substrate (450 mm wafer) such as a circular-disk-shaped substrate having the diameter of 450 mm, for example, the wafer W does not deform, warp, curve or the like in a wrinkle-like manner easily and the gap is not generated partially between the rear surface of the wafer W and the placement surface 54a (the upper surfaces of the wall part 54c and the plurality of protruding parts 54b), and thus the wafer W is held by the wafer holder 54 to have high flatness.

Moreover, in the present embodiment, as illustrated in FIG. 8(A), the plurality of convex parts 46c are placed to surround the suction hole 45a in the region (the suction region) surrounded by the wall part 46b at the tip part 46 of each lift pin 44. Thus, the large wafer W can be supported more stably by enlarging the outer shape of the wall part 46b, and the suction force (the attracting force) can be increased by enlarging an area size of the negative region and thus the large wafer W can be held by larger suction force stably. Moreover, even when the pressure in the suction region becomes negative by the suction (the vacuum suction), it is possible to prevent the wafer W to locally deform because the convex parts 46c in the suction region support the rear surface of the wafer W. Thus, the residual distortion of the wafer W decreases more when the wafer W is carried from the lift pins 44 to the wafer holder 54.

On the other hand, as illustrated by a lift pin 74 in a comparison example in FIG. 8(B), if the convex part is not placed inside a wall part 46Hb placed at a periphery of a bottom part 46Ha of a tip part 46H, the vacuum suction possibly causes the local distortion of the wafer W and this distortion may lead to the residual distortion when the wafer W is carried to the wafer holder 54.

Then, the wafer W is aligned by the alignment system AL during a period during which the wafer stage WST moves to allow the wafer W to move to an underside of the projection optical system PL (an exposing position) (step 118). The image of the pattern of the reticle R scanning-exposes each shot region on the wafer W by moving the wafer W on the basis of the result of the alignment (step 120), Then, the wafer stage WST moves to the unloading position UP, the suction unit 52 of the wafer holding apparatus 8 stops sucking the wafer W, the wafer W is lifted up by the lift pins 44, and the wafer W is carried to the wafer carriage robot (not illustrated) for the unload, and thus the wafer W is unloaded (step 122). The unloaded wafer W is carried to a coater/developer (not illustrated) and then is developed. Then, if next wafer is exposed (step 124), the operation from the step 104 to the step S122 is repeated.

As described above, according to the exposure method in the present embodiment, since the outer shape of the tip part 46 of the lift pin 44 is large, the wafer W can he supported in a state where the wafer W is stably sucked and supported, even when the wafer W is large. Moreover, since the plurality of convex parts 46c are placed in the region (the suction region) surrounded by the wall part 46b at the tip part 46 of the lift pin 44 and the local deformation of the wafer W is prevented when the lift pins 44 suck and support the wafer W, the high flatness of the wafer W can be maintained when the wafer W is carried to the wafer holder 54. Therefore, high throughput can be achieved by using the large wafer W and the image of the pattern of the reticle R can be transferred highly precisely by maintaining high exposure accuracy (resolution or the like) at all surface of the wafer W.

As described above, the exposure apparatus EX in the present embodiment includes the wafer holding apparatus 8 that holds the wafer W (the substrate). The wafer holding apparatus 8 includes: the wafer holder 54 (a substrate holding part) on which wafer W is placed; and the lift pin 44 (a supporting member) that is configured to be lifted up and down with respect to the wafer holder 54, the tip part 46 (an end part) of the lift pin 44 includes: the bottom part 46a (a suction part) that forms the suction region 46s for sucking the rear surface of the wafer W; and the convex part 46c (a supporting part) that supports the rear surface of the wafer W in the suction region 46s.

Moreover, from another point of view, the wafer holding apparatus 8 includes: the wafer holder 54 (a substrate holding part) on which wafer W is placed; and the lift pin 44 (a supporting member) that is configured to be lifted up and down with respect to the wafer holder 54, the tip part 46 (an end part) of the lift pin 44 includes: the wall part 46b (a first supporting part) that supports the rear surface of the wafer W and that is ring-like; and the concave part 46c (a second supporting part) that supports the rear surface of the wafer W in the suction region (a region) surrounded by the wall part 46b.

Moreover, the method of holding the wafer W by the wafer holding apparatus 8 includes: the step 106 in which the tip portions 46 (the end parts) of the lift pins 44 contact the wafer W and the lift pins 44 suck the wafer W; the step 112 at which the tip portions 46 of the lift pins 44 are lifted down in the Z direction to a side of the wafer holder 54; and the step 114 at which the suction unit 52 stops sucking the wafer W via the lift pins 44.

According to the present embodiment, the convex part 46c (the supporting part or the second supporting part) is in the suction region 46s that is surrounded by the wall part 46b of the tip part 46 when the tip part 46 (the end part) of the lift pin 44 supports the wafer W by the suction for example, and thus the local deformation of the wafer W at the tip part 46 can be prevented. Therefore, even if the wafer W is large, it is possible to stably support the wafer W by enlarging the tip part 46 of the lift pin 44 and it is possible to suppress the local deterioration of the flatness of the wafer W when the wafer W is placed at the wafer holder 54 (a target position).

Moreover, in the present embodiment, the lift pin 44 is movable in the Z direction (in a direction along a normal line of the placement surface 54a) through the placement surface 54a fur the wafer W of the wafer holder 54, and the lift pin 44 includes: the axis part 45 (a bar-shaped part) in which the suction hole 45a (it is also referred to as a first opening or passage) through which exhausts the air by a first suction part is formed; and the tip part 46 that is placed at a tip part of the axis part 45 to support the wafer W and the tip part 46 includes: the bottom part 46a that is configured to face the wafer W via a predetermined gap; the convex wall part 46b that is placed at the button part 46a so as to surround at least one portion of a surface of the button part 46a that is configured to thee the wafer W; and the plurality of convex parts 46c that are placed at a region of the bottom part 46a surrounded by the wall part 46b and that is configured to support the wafer W, a region that is surrounded by the bottom part 46a and the wall part 46b communicates with the suction hole (the passage) 45a of the axis part 45. Thus, the tip part of the lift pin 44 is capable of stably holding the rear surface of the wafer W by the vacuum suction.

Moreover, the exposure apparatus EX in the present embodiment is an exposure apparatus that projects the pattern of the reticle R with the illumination light IL (exposure light) for the exposure and exposes the wafer W with the illumination light IL via the pattern, the exposure apparatus EX includes: the wafer holding apparatus 8 for holding the wafer W that is the exposed target; and the wafer stage WST that moves with holding the wafer holder 54 of the wafer holding apparatus 8. Moreover, the exposure method by the exposure apparatus EX includes: the steps 106 to 116 in which the wafer holding apparatus 8 holds the wafer W; and the step 118 in which the held wafer W moves to an exposure position.

According to the exposure apparatus EX or the exposure method in the present embodiment, the high throughput can be achieved by using the large wafer W, for example, and it is possible to stably support the wafer W when the wafer W is carried from the wafer carriage robot WLD to the wafer holder 54 and it is possible to maintain the high flatness of the wafer W when the wafer W is placed on the wafer holder 54. Thus, the high exposure accuracy can be achieved.

Incidentally, the above described embodiment can be modified as described below. Incidentally, when the following modifications are explained, a part in FIG. 9 to FIG. 10(E) that corresponds to the part in FIG. 4(A) to FIG. 5(B) has a same or similar reference number and its detailed explanation will be omitted.

Firstly, in the above described embodiment, the wafer holding apparatus 8 has three lift pins 44, for example. On the other hands, as illustrated by a wafer holding apparatus 8A in the modified example in FIG. 9, the lift pin 44 may be placed at the center of the region of the wafer holder 54 surrounded by the side wall 54c and the plurality of (for example, six) lift pins 44 may be placed at equal angle intervals along the circumference CT surrounding the center, and the wafer W may be carried by the plurality of lift pins 44.

In this modified example, for example, a Z position of the tip of the lift pin 44 at the center may be slightly lower than Z positions of the tips of the plurality of lift pins 44 surrounding it, arid the wafer W may be carried to the wafer holder 54 by lifting down these lift pins 44 under the condition where the wafer W is sucked to be convex toward a side of the wafer holder 54, According to this, even if the wafer W is the wafer having the diameter of 450 mm, it is possible to certainly prevent the occurrence of the wrinkle or the like when the wafer W is placed on the wafer holder 54. Moreover, a bar-shaped member that is movable in the Z direction without the suction unit may be used instead of the lift pin 44 at the center.

Moreover, in the above described embodiment, the convex parts 46c having the truncated conical shapes are placed inside the wall part 46b of the tip part 46. On the other hand, as illustrated by a lift pin 44C in the modified example in FIG. 10(A), a plurality of convex parts 46e1 and 46e2 having curved wall-like shapes (or circular arc shapes) may be placed in the suction region 46s surrounded by the wall part 46b of the tip part 46 to surround the suction hole 45 and the wafer W may be supported by their upper surfaces (end parts). FIG. 10(B) is a vertical cross-sectional view of the lift pin 44C in FIG. 10(A). As illustrated in FIG. 10(B), the axis part 45 of the lift pin 44C has, at a position that is closed to the tip part 46, an elastic hinge part 45b that is configured to elastically incline and at which the diameter is smaller. Moreover, the upper surfaces of the convex parts 46e1 and 46e1 and the upper surface of the wall part 46b contact with same plane Q1, however, the height of the upper surface of the wall part 46b may be slightly lower.

Even when the lift pin 44C in the modified example, the convex parts 46e1 and 46e2 is capable of preventing the local deformation of the wafer W. Moreover, since the elastic hinge part 45b is placed, the tip part 46 is capable of easily inclining (is allowed to incline) by the elastic deformation in accordance with the wafer W when the wafer W deforms due to its own weight. Thus, the local deformation of the wafer W can be reduced more in some cases.

Moreover, as illustrated by a lift pin 44D in another modified example in FIG. 10(C), a plurality of (or one may be possible) ring-like convex parts 46f1 and 46f2 may be placed concentrically in the region of the tip part 46 surrounded by the wall part 46b to surround the suction hole 45a. FIG. 10(D) is a vertical cross-sectional view of the lift pin 44D in FIG. 10(C). As illustrated in FIG. 10(D), an opening 46g1 that communicates with the suction hole 45a is formed at a region of the tip part 46 of the lift pin 44D between the convex parts 46f1 and 46f2, and an opening 46g2 that communicates with the suction hole 45a is formed between the convex part 46f2 and the wall part 46b. According to this, the air can be simultaneously and appropriately exhausted from a space between the wall part 46b and the convex part 46f2, a space between the convex parts 46f1 and 46f2 and a space inside the convex part 46f1 when the wafer W is placed on the tip part 46, and thus the wafer W can be stably sucked. In addition, the convex parts 46f1 and 46f2 is capable of preventing the local deformation of the wafer W.

Moreover, as illustrated by a lift pin 64 in additional another modified example in FIG. 10(E), a tip part 65 having branch toward three direction, for example, may be coupled to the upper end of the axis part 45, the wall part 65b may be placed to surround an outline of the tip part 65, and a plurality of convex parts 65c may be placed in the region (suction region) surrounded by the wall part 65b to surround the suction hole 45a. Even when this lift pin 64 is used, the wafer W can be lifted up and down without locally deforming the wafer W.

Moreover, as illustrated by a lift pin 44C1 in the modified example in FIG. 11(A), a plurality of convex parts 46e1 and 46e2 having curved wall-like shapes, for example, may be placed in the region of the tip part 46 surrounded by the wall part 46b to surround the suction hole 45a, and at least one portion of the wall-like convex parts 46e1 and 46e2 may be a convex part 46e3 having one end coupled to the wall part 46b.

Moreover, as illustrated by a lift pin 44C2 in another modified example in FIG. 11(B), a plurality of wall-like convex parts 46e4 may be radially placed in the region of the tip part 46 surrounded by the wall part 46b to surround the suction hole 45a. In an example in FIG. 11(B), end parts of the wall-like convex parts 46e4 are coupled to the wall part 46b, however, the end part of the convex part 46e4 may be placed to be away from the wall part 46b. In the lift pin 44C2, the wall part 46b is formed to have a rimmed shape (ring-like shape) while the plurality. of convex parts 46e4 are placed radially.

Moreover, as illustrated by a lift pin 44C3 in another modified example in FIG. 11(C), the plurality of convex parts 46c having the truncated conical shapes may be placed in the region of the tip part 46 surrounded by the wall part 46b, and a plurality of convex parts 46c1 may be placed to be coupled to the wall part 46b and the shape of the half of the convex part 46c1 is the truncated conical shapes. According to this, the plurality of convex parts 46c and 46c1 can be placed at all grid points of the two-dimensional grid having a regular grid in the region of the lift pin 44C3 surrounded by the wall part 46b.

Even when the lift pins 44C1 to 44C3 in these modified examples are used, the wafer IV can be lifted up and down without locally deforming the wafer W Incidentally, in the lift pins 44, 44A, 44B, 64, 44C3 and the like, a cylindrical or prismatic (for example, a hexagonal prismatic) convex part having a cross-sectional area larger than an area of the upper surface of the convex parts 46c may be placed instead of the convex part 46c having the truncated conical shape or the truncated conical shape with steps. Moreover, the convex part 46c may be formed to have a tube-like shape (for example, a circular tube-like shape or a polygonal tube-like shape) instead of the cylindrical shape or the prismatic shape.

Moreover, in the above described embodiment, the suction unit 52 holds the wafer W by the vacuum suction at the wafer holder 54 via the suction holes 55A to 55D and the like, however, the wafer W may be held at the wafer holder 54 by electrostatic attraction. If the electrostatic attraction is performed, the placement surface of the wafer holder 54 may be planar without placing the plurality of protruding parts 54b on the upper surface of the wafer holder 54 and the planar surface may support the wafer W.

Second Embodiment

A second embodiment will be explained with reference to FIG. 12(A) and FIG. 12(B). A basic structure of an exposure apparatus in the present embodiment is same as that of the exposure apparatus EX in FIG. 1. A structure of a wafer holding apparatus is also same as that in the above described embodiment, however, a structure of the lift pin is different. Incidentally, a part in FIG. 12(A) and FIG. 12(B) that corresponds to the part in FIG. 5(A) and FIG. 5(B) has a same or similar reference number and its detailed explanation will be omitted.

FIG. 12(A) is an enlarged plan view illustrating a lift pin 44E in the present embodiment that is configured to suck and support the wafer W. FIG. 12(B) is a vertical cross-sectional view illustrating the lift pin 44E in FIG. 12(A) from which one portion of the axis part 45 is omitted. In FIG. 12(A) and FIG. 12(B), the lift pin 44E (supporting member) includes: the axis part 45 (bar-shaped member) in which the suction hole 45a is formed; and a tip part 46A that is coupled to the tip of the axis part 45 to support the wafer W. And, the tip part 46A includes: a bottom part 46Aa; a circular wall-part 46Ab that is placed at a periphery of the bottom part 46Aa; a contacting part (facing part) 48 that is fixed in a region surrounded by the wall part 46Ab, that is made of a breathable porous member and that is configured to face the wafer W, and the contacting part 48 communicates with the suction hole 45a (the first opening) in the axis part 45. The wall part 46Ab is formed to have an outer shape that is larger than the outer shape of the axis part 45. Moreover, a porous ceramic can be used as the contacting part 48, for example. An upper surfaces of the wall part 46Ab and the contacting part 48 are processed to have high flatness.

The outer shape of the wall part 46Ab of the tip part 46A is preferably a circular shape baying a diameter of 5 mm to 15 mm, width (thickness) of the wall part 46Ab is preferably 0.05 mm to 0.6 mm, as one example. Incidentally, the outer shape of a convex part 46Ac may be a polygonal shape or the like. Moreover, the upper surface of the contacting part 48 and the upper surface of the wall part 46Ab are at the same height (on same plane Q1). Another structure is same as that in FIG. 4(A) and FIG. 4(B).

And, when the lift pin 44E in the present embodiment is used instead of the lift pin 44 in FIG. 4(A), the wafer holding apparatus in the present embodiment (a substrate holding apparatus) for holding the wafer W includes: the wafer holder 54 (a substrate holding part) on which the wafer W is placed; and a lift pin 44E (a supporting member) that is configured to be lifted up and down with respect to the wafer holder 54. And, the tip part 46A (an end part) of the lift pin 44E includes: the contacting part 48 made of the porous member that includes a space part and that allows a pressure of at least one portion of the space part to be a negative pressure to suck the rear surface of the wafer; and the wall part 46Ab that is formed to surround entire circumference (or at least one portion) of the contacting part 48.

According to the present embodiment, when the wafer W is supported by the tip part 46A of the lift pin 44E, the wafer W can be sucked by sucking the air by the suction unit 52 in FIG. 4(B), for example, via the contacting part 48 (the porous member) in the tip part 46A. Moreover, it is possible to prevent the local deformation of the wafer W at the tip part 46A, because a front surface of the contacting part 48 in the region of the tip part 46A surrounded by the wall part 46Ab is planar. Thus, even if the wafer W is large (for example, the wafer having the diameter of 450 mm), it is possible to stably support the wafer W by enlarging the tip part 46A of the lift pin 44E and it is possible to suppress the local deterioration of the flatness of the wafer W when the wafer W is placed at the placement surface 54a (the target position) of the wafer holder 54 in FIG. 4(B).

Incidentally, in the present embodiment, a height of the wall part 46Ab of the lift pin 44E may be lower by 50 nm to several micrometer, for example, than a height of the contacting part 48. If the height of the wall part 46Ab may be lower than that of the contacting part 48, the air flows through a gap between the wall part 46Ab and the wafer W when the suction hole 45a sucks the air and thus the wafer W can be stably sucked by Bernoulli effect in some cases.

Moreover, even in the present embodiment, a film (for example, the Diamond Like Carbon film) that allows easy slip may be formed on a surface (facing surface) of the tip part 46A that contacts with the wafer W and that is made of the silicon carbide ceramic, for example.

Moreover, an elastic hinge part may be placed at the axis part 45 of the lift pin 44E and the tip part 46A may be configured to elastically deform in accordance with the water W.

By the way, for example, in an apparatus that does not require a high accuracy of the position of the wafer W in a direction along the XY plane, it may be assumed that the wafer is placed on the holding part and is not sucked. In this case, if a space or the like that does not support the wafer is under the wafer, it may be assumed that the wafer deforms by its own weight at this position and the flatness of the wafer locally deteriorates.

Thus, in this case, in an apparatus that includes the holding part on which the wafer is placed: and the supporting member that is configured to be lifted up and down with respect to the holding part, a ring-like first supporting part that supports the rear surface of the wafer and a second supporting part that supports the rear surface of the wafer in a region surrounded by the first supporting part may be placed at an end part of the supporting member. According to this, it is possible to prevent the local deterioration of the flatness of the wafer W.

Moreover, the wafer W is circular shape having the diameter of 300 mm to 450 mm in the above described embodiment, however, the diameter of the wafer W may be any value, and the diameter of the wafer W may be smaller than 300 mm or larger than 450 mm.

Moreover, when an electronic device (or a micro device) such as a semiconductor device or the like is manufactured by using the exposure apparatus EX or the exposure method in the above described each embodiment, the electronic device is manufactured through a step 221 at which function and performance of the electronic device is designed, a step 222 at which the mask (the reticle) based on the step for the design is manufactured, a step 223 at which the substrate (the wafer) that is the base material of the device is manufactured and it is coated with the resist, a substrate processing step 224 including a process of exposing the substrate (the photosensitive substrate) with the pattern of the reticle by using the exposure apparatus (the exposure method) in the above described embodiment, a process of developing the exposed substrate, a process of heating (curing) and etching the developed substrate and the like, a device assembling step 225 (including a process such as a dicing process, a bonding process, a packaging process and the like), an inspection step 226 and the like.

In other words, a method of manufacturing the device includes forming a pattern of a photosensitive layer on the substrate by using the exposure apparatus EX or the exposure method in the above described embodiment; and processing (developing or the like) the substrate on which the pattern is formed. At this time, according to the exposure apparatus EX or the exposure method in the above described embodiment, since the substrate can be held on the wafer stage with high flatness even if the substrate is large, it is possible to improve the throughput in manufacturing the electronic device and it is possible to manufacture the electronic device with high accuracy while maintaining high accuracy of the exposure.

Incidentally, the present invention can be employed not only for the above described scan-exposure type of projection exposure apparatus (the scanner) but also for a step-and-repeat type of projection exposure apparatus (a stepper or the like). Furthermore, the present invention can be also employed for a dry-exposure type of exposure apparatus other than the liquid immersion type of exposure apparatus.

Moreover, the present invention is not limited to the exposure apparatus for manufacturing the semiconductor device, and can be widely employed for an exposure apparatus for a display apparatus such as a liquid crystal element that is formed on a square glass plate, a plasma display or the like and an exposure apparatus for manufacturing various devices such as an imaging element (CCD or the like), a micro machine, a thin film magnetic head, a DNA chip and the like, for example. Furthermore, the present invention can be employed for an exposure apparatus when a mask (a photomask, a reticle or the like) on which mask pattern for various devices is formed is manufactured by using photolithography process.

Incidentally, the present invention is not limited to the above described embodiments, and various constitutions can be employed without departing from the essence of the present invention.

DESCRIPTION OF REFERENCE CODES

EX1 exposure apparatus
R reticle
W wafer
WST wafer stage
8, 8A wafer holding apparatus
44 to 44E lift pin
45 axis part
45a suction hole
46 tip part
46b wall part
46c convex part
52 suction unit
54 wafer holder
56 driving unit
62 vacuum pump

The invention claimed is:

1. A substrate holding apparatus for holding a substrate, the apparatus comprising:
- a substrate holding part on which the substrate is placed; and
- a supporting member that is configured to be lifted up and down with respect to the substrate holding part,
- an end part of the supporting member including:
- a suction part for sucking a rear surface of the substrate; and
- a supporting part that supports the rear surface of the substrate,
- wherein the suction part includes a wall part that surrounds the supporting part.

2. The substrate holding apparatus according to claim 1, wherein
- the end part of the supporting member includes a plurality of supporting parts.

3. The substrate holding apparatus according to claim 1, wherein
- the wall part is formed to have a rimmed shape.

4. The substrate holding apparatus according to claim 1, wherein
- the suction part includes a bottom part that is formed below an upper end of the wall part in a lift direction of the supporting member,
- the supporting part is placed at the bottom part.

5. The substrate holding apparatus according to claim 4, wherein
- the supporting part is formed at the bottom part to have a truncated conical shape.

6. The substrate holding apparatus according to claim 4, wherein
- a plurality of supporting parts are placed at the bottom part concentrically.

7. The substrate holding apparatus according to claim 1, wherein
- an upper end of the supporting part is formed to have a circular shape.

8. The substrate holding apparatus according to claim 1, wherein
- the suction part includes a bottom part that is formed below an upper end of the wall part in a lift direction of the supporting member,
- an outer shape of the wall part is a circular shape having a diameter of 5 mm to 15 mm and width of the wall part is 0.05 mm to 0.6 mm,
- a shape of an upper end of the supporting part is a circular shape having a diameter of 0.05 mm to 0.6 mm,
- the supporting member includes a bar-shaped part that is coupled to the bottom part, and
- a cross-sectional area of the bar-shaped part along a surface that intersects a direction along the lift direction is smaller than a cross-sectional area of the outer shape of the wall part along the intersecting surface.

9. The substrate holding apparatus according to claim 1, wherein the supporting part includes a wall-shaped member, a shape of an end surface of the wall-shaped member includes a curved shape.

10. The substrate holding apparatus according to claim 9, wherein the curved shape is a circular arc shape.

11. The substrate holding apparatus according to claim 1, wherein the supporting part includes at least one ring-like wall-shaped member.

12. The substrate holding apparatus according to claim 1, wherein a plurality of supporting members are placed along a circumference of a circle having predetermined diameter.

13. The substrate holding apparatus according to claim 1, wherein the substrate has a circular shape having a diameter of approximately 450 mm, and a plurality of supporting members are placed at the substrate holding part along a circumference of a circle having a diameter of 180 mm to 350 mm.

14. The substrate holding apparatus according to claim 1, wherein the suction part sucks the substrate by using suction force that is caused by negative pressure.

15. The substrate holding apparatus according to claim 1, wherein the supporting member includes:

a bar-shaped part that is coupled to the end part; and a hinge part that allows the end part to incline with respect to the bar-shaped part in a lift direction.

16. The substrate holding apparatus according to claim 1, wherein an opening is formed at at least one portion of the suction part and the suction part includes a bottom part that is formed below an upper end of the wall part in a lift direction of the supporting member, and a passage is formed in the supporting member, a pressure in the passage can be set to negative pressure and the passage communicates with the opening.

17. The substrate holding apparatus according to claim 16, wherein the supporting part is placed at the bottom part.

18. The substrate holding apparatus according to claim 16, wherein the end part of the supporting member includes a plurality of supporting parts, and the plurality of supporting parts are placed around the opening concentrically.

19. The substrate holding apparatus according to claim 16, wherein the supporting part is placed at the bottom part and includes at least one ring-like wall-shaped member that surrounds the opening, and a second opening is formed at a region of the bottom part between the wall part and the wall-shaped member, the passage communicates with the second opening.

20. An exposure apparatus that projects a pattern with exposure light and exposes a substrate with the exposure light via the pattern, comprising:

the substrate holding apparatus according to claim 1 for holding the substrate that is an exposed target; and a stage that moves with the substrate holding apparatus being placed thereon.

21. A method of manufacturing a device, the method comprising:

forming a pattern of a photosensitive layer on a substrate by using the exposure apparatus according to claim 20; and processing the substrate on which the pattern is formed.

22. A substrate holding method that uses the substrate holding apparatus according to claim 1, comprising:

moving the end part of the supporting member of the substrate holding apparatus to an upside of the substrate holding part;

receiving the substrate at the end part of the supporting member;

sucking the substrate by the suction part;

lifting down the end part of the supporting member with respect to the substrate holding part;

stopping the suction of the substrate by the suction part; and delivering the substrate from the end part of the supporting member to the substrate holding part.

23. A substrate holding apparatus for holding a substrate, comprising:

a substrate holding part on which the substrate is placed; and a supporting member that is configured to be lifted up with respect to the substrate holding part, an end part of the supporting member including:

a looped first supporting part that supports a rear surface of the substrate; and a second supporting part that supports the rear surface of the substrate in a region surrounded by the first supporting part.

24. An exposure method of projecting a pattern with exposure light and exposing a substrate with the exposure light via the pattern, comprising:

holding the substrate by using the substrate holding method according to claim 22; and moving the substrate to an exposure position.

25. A method of manufacturing a device, the method comprising:

forming a pattern of a photosensitive layer on a substrate by using the exposure method according to claim 24; and processing the substrate on which the pattern is formed.

26. A substrate holding apparatus for holding a substrate, comprising:

a substrate holding part on which the substrate is placed; and a supporting member that is configured to be lifted up and down with respect to the substrate holding part, an end part of the supporting member including:

a porous member that includes a space part and allows a pressure of at least one portion of the space part to be a negative pressure to suck a rear surface of the substrate; and a wall part that is formed to surround at least one portion of the porous member.

27. The substrate holding method according to claim 22, wherein the substrate starts to be sucked to the substrate holding part when the substrate is delivered to the substrate holding part.

28. The substrate holding apparatus according to claim 23, wherein the end part of the supporting member includes a plurality of the second supporting parts.

29. The substrate holding apparatus according to claim 23, wherein the first supporting part is formed to have a rimmed shape.

30. The substrate holding apparatus according to claim 23, wherein the end part of the supporting member includes a bottom part that is formed below an upper end of the first supporting part in a lift direction of the supporting member, the second supporting part is placed at the bottom part.

31. The substrate holding apparatus according to claim 30, wherein the second supporting part is formed at the bottom part to have a truncated conical shape.

32. The substrate holding apparatus according to claim 30, wherein a plurality of the second supporting parts are placed at the bottom part concentrically.

33. The substrate holding apparatus according to claim 23, wherein an upper end of the second supporting part is framed to have a circular shape.

34. The substrate holding apparatus according to claim 23, wherein the end part of the supporting member includes: a bottom part that is formed below an upper end of the first supporting part in a lift direction of the supporting member, an outer shape of the first supporting part is a circular shape having a diameter of 5 mm to 15 mm and width of the first supporting part is 0.05 mm to 0.6 mm, a shape of an upper end of the second supporting part is a circular shape having a diameter of 0.05 mm to 0.6 mm, the supporting member includes a bar-shaped part that is coupled to the bottom part, and a cross-sectional area of the bar-shaped part along a surface that intersects a direction along the lift direction is smaller than a cross-sectional area of the outer shape of the first supporting part along the intersecting surface.

35. The substrate holding apparatus according to claim 23, wherein the second supporting part includes a wall-shaped member, a shape of an end surface of the wall-shaped member includes a curved shape.

36. Use substrate holding apparatus according to claim 35, wherein the curved shape is a circular arc shape.

37. The substrate holding apparatus according to claim 23, wherein the second supporting part includes at least one ring-like wall-shaped member.

38. The substrate holding apparatus according to claim 23, wherein a plurality of the supporting members are placed along a circumference of a circle having predetermined diameter.

39. The substrate holding apparatus according to claim 23, wherein the substrate has a circular shape having a diameter of approximately 450 mm, and a plurality of the supporting members are placed at the substrate holding part along a circumference of a circle having a diameter of 180 mm to 350 mm.

40. The substrate holding apparatus according to claim 23, wherein the supporting member includes:

a bar-shaped part that is coupled to the end part; and a hinge part that allows the end part to incline with respect to the bar-shaped part in a lift direction.

*41. A substrate holding apparatus for holding a substrate, the apparatus comprising:*

*a substrate holding part on which the substrate is placed; and*

*a supporting member that is configured to be lifted up and down with respect to the substrate holding part,*

*an end part of the supporting member including:*

*a suction part for sucking a rear surface of the substrate; and*

*a supporting part that supports the rear surface of the substrate,*

*wherein the suction part includes (i) a wall part that surrounds the supporting part and (ii) a suction hole for forming a negative pressure space that causes suction force in vacuum-sucking the substrate.*

* * * * *